US012670830B2

(12) United States Patent (10) Patent No.: US 12,670,830 B2
Liu et al. (45) Date of Patent: Jun. 30, 2026

(54) GATE DRIVING CIRCUIT AND DRIVING METHOD THEREOF, DISPLAY PANEL AND DISPLAY DEVICE

(71) Applicants:HEFEI BOE JOINT TECHNOLOGY CO., LTD., Hefei (CN); BOE TECHNOLOGY GROUP CO., LTD., Beijing (CN)

(72) Inventors: Xiuting Liu, Beijing (CN); Zhidong Yuan, Beijing (CN); Can Yuan, Beijing (CN); Liu Wu, Beijing (CN); Yongqian Li, Beijing (CN); Cheng Xu, Beijing (CN); Miao Liu, Beijing (CN); Xing Yao, Beijing (CN)

(73) Assignees: HEFEI BOE JOINT TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/263,154

(22) PCT Filed: Sep. 30, 2022

(86) PCT No.: PCT/CN2022/123223
§ 371 (c)(1),
(2) Date: Jul. 27, 2023

(87) PCT Pub. No.: WO2024/065658
PCT Pub. Date: Apr. 4, 2024

(65) Prior Publication Data
US 2025/0225907 A1 Jul. 10, 2025

(51) Int. Cl.
*G09G 3/20* (2006.01)
*G11C 19/28* (2006.01)

(52) U.S. Cl.
CPC ......... *G09G 3/2092* (2013.01); *G11C 19/287* (2013.01); *G09G 2300/0426* (2013.01);
(Continued)

(58) Field of Classification Search
CPC ......... G09G 3/2092; G09G 2300/0426; G09G 2310/0267; G09G 2310/0286;
(Continued)

(56) References Cited

U.S. PATENT DOCUMENTS 11,270,629 B2 * 3/2022 Yu ........................ G09G 3/3266
12,230,216 B2 * 2/2025 Lu .......................... G11C 19/28
(Continued)

FOREIGN PATENT DOCUMENTS

CN 101212854 B 5/2013
CN 105159507 A 12/2015
(Continued)

OTHER PUBLICATIONS

First Chinese Office Action in Application No. 2022800033915; Mailing Date: Jan. 28, 2026.

*Primary Examiner* — Jose R Soto Lopez
(74) *Attorney, Agent, or Firm* — Dilworth & Barrese, LLP.; Michael J. Musella, Esq.

(57) ABSTRACT

A gate driving circuit and a method for driving a gate driving circuit, a display panel, and a display device are provided. The gate driving circuit includes M groups of shift register units, and each group includes one first shift register unit and N−1 second shift register units. The first noise reduction of the first shift register unit performs noise reduction under control of the second node. The second noise reduction circuit of the second shift register units performs noise reduction under control of the second node. In a same group of shift register units, the first shift register unit and the second shift register units share a same second node. A first (Continued)

input signal and a second input signal received by a Kth group of shift register units are a shift signal of a first shift register unit in a (K–2)th group of shift register units.

19 Claims, 14 Drawing Sheets

(52) U.S. Cl.
CPC .............. *G09G 2310/0267* (2013.01); *G09G 2310/0286* (2013.01); *G09G 2310/061* (2013.01)

(58) Field of Classification Search
CPC ........... G09G 2310/061; G09G 3/3266; G09G 3/3677; G09G 3/20; G09G 3/36; G11C 19/287; G11C 19/28
See application file for complete search history.

(56) References Cited

U.S. PATENT DOCUMENTS

| | | | |
|---|---|---|---|
| 2007/0290982 A1 | 12/2007 | Kim et al. | |
| 2008/0158137 A1 | 7/2008 | Yoshida | |
| 2011/0057190 A1* | 3/2011 | Kimura | H10D 86/423 |
| | | | 257/E27.06 |
| 2013/0136224 A1* | 5/2013 | Qing | G11C 19/28 |
| | | | 377/64 |
| 2013/0321499 A1* | 12/2013 | Park | G09G 3/3275 |
| | | | 345/698 |
| 2014/0267214 A1* | 9/2014 | Hwang | G09G 3/3648 |
| | | | 345/212 |

| | | | |
|---|---|---|---|
| 2016/0293094 A1* | 10/2016 | Park | G09G 3/20 |
| 2017/0115802 A1 | 4/2017 | Sun et al. | |
| 2017/0256203 A1* | 9/2017 | Han | G11C 19/287 |
| 2018/0144711 A1* | 5/2018 | Noh | G09G 3/3677 |
| 2018/0182345 A1* | 6/2018 | Seong | G09G 3/3688 |
| 2018/0218685 A1* | 8/2018 | Li | G09G 3/3696 |
| 2018/0337682 A1* | 11/2018 | Takasugi | H03K 21/18 |
| 2019/0035322 A1* | 1/2019 | Kim | H10D 86/60 |
| 2019/0073948 A1* | 3/2019 | Wang | G09G 3/3225 |
| 2019/0228830 A1* | 7/2019 | Xu | G11C 19/287 |
| 2019/0311691 A1* | 10/2019 | Feng | G09G 3/36 |
| 2020/0035317 A1 | 1/2020 | Feng et al. | |
| 2020/0133327 A1* | 4/2020 | Lee | G06F 1/08 |
| 2020/0243034 A1 | 7/2020 | Gu et al. | |
| 2020/0342808 A1* | 10/2020 | Han | G09G 3/3266 |
| 2021/0118375 A1* | 4/2021 | Yang | G09G 3/3266 |
| 2021/0225251 A1* | 7/2021 | Xu | G09G 3/2092 |
| 2021/0335199 A1* | 10/2021 | Yuan | G09G 3/2092 |
| 2021/0335200 A1* | 10/2021 | Yuan | G09G 3/3677 |
| 2022/0020332 A1* | 1/2022 | Yang | G09G 3/3266 |
| 2022/0284842 A1* | 9/2022 | Chen | G09G 3/20 |
| 2024/0090264 A1* | 3/2024 | Kim | H10K 59/1213 |

FOREIGN PATENT DOCUMENTS

| | | |
|---|---|---|
| CN | 108648716 A | 10/2018 |
| CN | 108877683 A | 11/2018 |
| CN | 108932933 A | 12/2018 |
| CN | 109166542 A | 1/2019 |
| CN | 113035111 A | 6/2021 |
| CN | 113661536 A | 11/2021 |
| CN | 114067712 A | 2/2022 |

* cited by examiner

Display panel 20

Gate driving circuit 21

GATE DRIVING CIRCUIT AND DRIVING METHOD THEREOF, DISPLAY PANEL AND DISPLAY DEVICE

TECHNICAL FIELD

Embodiments of the present disclosure relate to a gate driving circuit and a method for driving a gate driving circuit, a display panel, and a display device.

BACKGROUND

In the field of display technologies, for example, a pixel array of a display panel usually includes a plurality of rows of gate lines and a plurality of columns of data lines intersecting with each other. The gate lines can be driven by a gate driving circuit. For example, the gate driving circuit can be implemented through bundled integrated driving circuits. In recent years, with continuous improvement of the preparation process of amorphous silicon thin film transistors or oxide thin film transistors, the gate driving circuit may also be directly integrated on a thin film transistor array substrate to form a gate-driver on array (GOA) to drive the gate lines. Currently, the GOA technology is adopted increasingly for a display panel to drive gate lines, and the GOA may be applied to a liquid crystal display panel and an organic light-emitting diode (OLED) display panel. The GOA technology helps implement narrow frames and can reduce production costs.

SUMMARY

At least one embodiment of the present disclosure provides a gate driving circuit which comprises M groups of shift register units. Each group of shift register units comprises N shift register units, the N shift register units output N signals which are sequentially shifted, the M groups of shift register units output M*N signals which are sequentially shifted, and M and N are positive integers; each group of shift register units comprises one first shift register unit and N−1 second shift register units; the first shift register unit comprises a first input circuit, a first output circuit, a first control circuit, and a first noise reduction circuit; the first input circuit is connected to a first input terminal, a first node, and a first source signal terminal, and is configured to write a first source signal of the first source signal terminal into the first node in response to a first input signal of the first input terminal, so as to control a level of the first node; the first output circuit is connected to the first node, a first clock signal terminal, a first scanning signal output terminal, and a shift signal output terminal, and is configured to receive a first clock signal of the first clock signal terminal, and output a first scanning signal through the first scanning signal output terminal and output a shift signal through the shift signal output terminal under control of the level of the first node; the first control circuit is connected to the first node, a second clock signal terminal, and a second node, and is configured to control a level of the second node under control of the level of the first node and a second clock signal of the second clock signal terminal; the first noise reduction circuit is connected to the first node, the second node, the first scanning signal output terminal, and the shift signal output terminal, and is configured to perform noise reduction on the first node, the first scanning signal output terminal, and the shift signal output terminal under control of the level of the second node; each second shift register unit comprises a second input circuit, a second output circuit, and a second noise reduction circuit; the second input circuit is connected to a second input terminal, a third node, and a second source signal terminal, and is configured to write a second source signal of the second source signal terminal into the third node in response to a second input signal of the second input terminal, so as to control a level of the third node; the second output circuit is connected to the third node, a third clock signal terminal, and a second scanning signal output terminal, and is configured to receive a third clock signal of the third clock signal terminal, and output a second scanning signal through the second scanning signal output terminal under control of the level of the third node; the second noise reduction circuit is connected to the second node, the third node, and the second scanning signal output terminal, and is configured to perform noise reduction on the third node and the second scanning signal output terminal under control of the level of the second node; in a same group of shift register units, the first shift register unit and the second shift register units share a same second node, and the first input signal received by the first shift register unit and the second input signal received by the second shift register units are a same signal; and a first input signal and a second input signal received by a Kth group of shift register units are a shift signal output by a first shift register unit in a $(K-2)$th group of shift register units, where $3 \leq K \leq M$ and K is an integer.

For example, in the gate driving circuit provided by an embodiment of the present disclosure, the first shift register unit further comprises a first reset circuit, and the second shift register unit further comprises a second reset circuit; the first reset circuit is connected to a first reset terminal and the first node, and is configured to reset the first node in response to a first reset signal of the first reset terminal; the second reset circuit is connected to a second reset terminal and the third node, and is configured to reset the third node in response to a second reset signal of the second reset terminal; in the same group of shift register units, the first reset signal received by the first shift register unit and the second reset signal received by the second shift register units are a same signal; and a first reset signal and a second reset signal received by a Qth group of shift register units are a shift signal output by a first shift register unit in a $(Q+3)$th group of shift register units, where $1 \leq Q \leq M-3$ and Q is an integer.

For example, in the gate driving circuit provided by an embodiment of the present disclosure, a 1st group of shift register units receives a first starting signal to serve as a first input signal and a second input signal of the 1st group of shift register units; a 2nd group of shift register units receives a second starting signal to serve as a first input signal and a second input signal of the 2nd group of shift register units; and the first starting signal is different from the second starting signal.

For example, the gate driving circuit provided by an embodiment of the present disclosure further comprises: a first preposed shift register unit and a second preposed shift register unit. The first preposed shift register unit is configured to receive a trigger signal to output the first starting signal; and the second preposed shift register unit is configured to receive the trigger signal to output the second starting signal.

For example, in the gate driving circuit provided by an embodiment of the present disclosure, an $(M-2)$th group of shift register units receives a first initialization signal to serve as a first reset signal and a second reset signal of the $(M-2)$th group of shift register units; an $(M-1)$th group of shift register units receives a second initialization signal to serve as a first reset signal and a second reset signal of the (M−1)th group of shift register units; an Mth group of shift register units receives a third initialization signal to serve as a first reset signal and a second reset signal of the Mth group of shift register units; and the first initialization signal, the second initialization signal, and the third initialization signal are different from each other.

For example, in the gate driving circuit provided by an embodiment of the present disclosure, N=4, the gate driving circuit is connected to 16 clock lines, and the 16 clock lines comprise a 1st clock line to a 16th clock line; each group of shift register units is numbered in an order of the first shift register unit, a first one second shift register unit, a second one second shift register unit, and a third one second shift register unit; the M groups of shift register units are numbered sequentially, so that 4*M shift register units contained in the gate driving circuit are sequentially numbered as a 1st shift register unit to a (4*M)th shift register unit; a (4X+1)th shift register unit is the first shift register unit; a (4X+2)th shift register unit, a (4X+3)th shift register unit, and a (4X+4)th shift register unit are the second shift register units, where X≥0 and X is an integer; and a first clock signal terminal of a (16Y+1)th shift register unit is connected to the 1st clock line; a third clock signal terminal of a (16Y+2)th shift register unit is connected to a 2nd clock line; a third clock signal terminal of a (16Y+3)th shift register unit is connected to a 3rd clock line; a third clock signal terminal of a (16Y+4)th shift register unit is connected to a 4th clock line; a first clock signal terminal of a (16Y+5)th shift register unit is connected to a 5th clock line; a third clock signal terminal of a (16Y+6)th shift register unit is connected to a 6th clock line; a third clock signal terminal of a (16Y+7)th shift register unit is connected to a 7th clock line; a third clock signal terminal of a (16Y+8)th shift register unit is connected to an 8th clock line; a first clock signal terminal of a (16Y+9)th shift register unit is connected to a 9th clock line; a third clock signal terminal of a (16Y+10)th shift register unit is connected to a 10th clock line; a third clock signal terminal of a (16Y+11)th shift register unit is connected to an 11th clock line; a third clock signal terminal of a (16Y+12)th shift register unit is connected to a 12th clock line; a first clock signal terminal of a (16Y+13)th shift register unit is connected to a 13th clock line; a third clock signal terminal of a (16Y+14)th shift register unit is connected to a 14th clock line; a third clock signal terminal of a (16Y+15)th shift register unit is connected to a 15th clock line; and a third clock signal terminal of a (16Y+16)th shift register unit is connected to the 16th clock line, where Y≥0 and Y is an integer.

For example, in the gate driving circuit provided by an embodiment of the present disclosure, a second clock signal terminal of the (16Y+1)th shift register unit is connected to the 9th clock line; a second clock signal terminal of the (16Y+5)th shift register unit is connected to the 13th clock line; a second clock signal terminal of the (16Y+9)th shift register unit is connected to the 1st clock line; and a second clock signal terminal of the (16Y+13)th shift register unit is connected to the 5th clock line.

For example, in the gate driving circuit provided by an embodiment of the present disclosure, N=4, the gate driving circuit is connected to 16 clock lines, and the 16 clock lines comprise a 1st clock line to a 16th clock line; each group of shift register units is numbered in an order of a first one second shift register unit, the first shift register unit, a second one second shift register unit, and a third one second shift register unit; the M groups of shift register units are numbered sequentially, so that 4*M shift register units contained in the gate driving circuit are sequentially numbered as a 1st shift register unit to a (4*M)th shift register unit; a (4D+2)th shift register unit is the first shift register unit; a (4D+1)th shift register unit, a (4D+3)th shift register unit, and a (4D+4)th shift register unit are the second shift register units, where D≥0 and D is an integer; and a third clock signal terminal of a (16J+1)th shift register unit is connected to the 1st clock line; a first clock signal terminal of a (16J+2)th shift register unit is connected to a 2nd clock line; a third clock signal terminal of a (16J+3)th shift register unit is connected to a 3rd clock line; a third clock signal terminal of a (16J+4)th shift register unit is connected to a 4th clock line; a third clock signal terminal of a (16J+5)th shift register unit is connected to a 5th clock line; a first clock signal terminal of a (16J+6)th shift register unit is connected to a 6th clock line; a third clock signal terminal of a (16J+7)th shift register unit is connected to a 7th clock line; a third clock signal terminal of a (16J+8)th shift register unit is connected to an 8th clock line; a third clock signal terminal of a (16J+9)th shift register unit is connected to a 9th clock line; a first clock signal terminal of a (16J+10)th shift register unit is connected to a 10th clock line; a third clock signal terminal of a (16J+11)th shift register unit is connected to an 11th clock line; a third clock signal terminal of a (16J+12)th shift register unit is connected to a 12th clock line; a third clock signal terminal of a (16J+13)th shift register unit is connected to a 13th clock line; a first clock signal terminal of a (16J+14)th shift register unit is connected to a 14th clock line; a third clock signal terminal of a (16J+15)th shift register unit is connected to a 15th clock line; and a third clock signal terminal of a (16J+16)th shift register unit is connected to the 16th clock line, where J≥0 and J is an integer.

For example, in the gate driving circuit provided by an embodiment of the present disclosure, a second clock signal terminal of the (16J+2)th shift register unit is connected to the 10th clock line; a second clock signal terminal of the (16J+6)th shift register unit is connected to the 14th clock line; a second clock signal terminal of the (16J+10)th shift register unit is connected to the 2nd clock line; and a second clock signal terminal of the (16J+14)th shift register unit is connected to the 6th clock line.

For example, in the gate driving circuit provided by an embodiment of the present disclosure, the 1st clock line to the 16th clock line output 16 different clock signals; and the 16 different clock signals are sequentially shifted in terms of timing.

For example, in the gate driving circuit provided by an embodiment of the present disclosure, among the 16 clock lines, clock signals output from a (4L+1)th clock line to a (4L+4)th clock line are identical, where L≥0 and L is an integer; and the 1st clock line to the 16th clock line output 4 different clock signals; and the 4 different clock signals are sequentially shifted in terms of timing.

For example, in the gate driving circuit provided by an embodiment of the present disclosure, among the 16 clock lines, clock signals output from a (2H+1)th clock line to a (2H+2)th clock line are identical, where H≥0 and H is an integer; and the 1st clock line to the 16th clock line output 8 different clock signals; and the 8 different clock signals are sequentially shifted in terms of timing.

For example, in the gate driving circuit provided by an embodiment of the present disclosure, N=2, the gate driving circuit is connected to 8 clock lines, and the 8 clock lines comprise a 1st clock line to an 8th clock line; each group of shift register units is numbered in an order of the first shift register unit and the second shift register unit; the M groups of shift register units are numbered sequentially, so that 2*M shift register units contained in the gate driving circuit are sequentially numbered as a 1st shift register unit to a (2*M)th shift register unit; a (2G+1)th shift register unit is the first shift register unit, and a (2G+2)th shift register unit is the second shift register units, where G≥0 and G is an integer; and a first clock signal terminal of a (8Z+1)th shift register unit is connected to the 1st clock line; a third clock signal terminal of a (8Z+2)th shift register unit is connected to a 2nd clock line; a first clock signal terminal of a (8Z+3)th shift register unit is connected to a 3rd clock line; a third clock signal terminal of a (8Z+4)th shift register unit is connected to a 4th clock line; a first clock signal terminal of a (8Z+5)th shift register unit is connected to a 5th clock line; a third clock signal terminal of a (8Z+6)th shift register unit is connected to a 6th clock line; a first clock signal terminal of a (8Z+7)th shift register unit is connected to a 7th clock line; and a third clock signal terminal of a (8Z+8)th shift register unit is connected to the 8th clock line, where Z≥0 and Z is an integer.

For example, in the gate driving circuit provided by an embodiment of the present disclosure, a second clock signal terminal of the (8Z+1)th shift register unit is connected to the 5th clock line; a second clock signal terminal of the (8Z+3)th shift register unit is connected to the 7th clock line; a second clock signal terminal of the (8Z+5)th shift register unit is connected to the 1st clock line; and a second clock signal terminal of the (8Z+7)th shift register unit is connected to the 3rd clock line.

For example, in the gate driving circuit provided by an embodiment of the present disclosure, the 1st clock line to the 8th clock line output 8 different clock signals, and the 8 different clock signals are sequentially shifted in terms of timing.

For example, in the gate driving circuit provided by an embodiment of the present disclosure, among the 8 clock lines, clock signals output from a (2R+1)th clock line to a (2R+2)th clock line are identical, where R≥0 and R is an integer; and the 1st clock line to the 8th clock line output 4 different clock signals, and the 4 different clock signals are sequentially shifted in terms of timing.

For example, in the gate driving circuit provided by an embodiment of the present disclosure, the first shift register unit further comprises a first initial reset circuit; the first initial reset circuit is connected to a first initial reset terminal and the first node, and is configured to reset the first node in response to a first initial reset signal of the first initial reset terminal; the second shift register unit further comprises a second initial reset circuit; and the second initial reset circuit is connected to a second initial reset terminal and the third node, and is configured to reset the third node in response to a second initial reset signal of the second initial reset terminal.

For example, in the gate driving circuit provided by an embodiment of the present disclosure, the first initial reset signal and the second initial reset signal are a same signal.

For example, in the gate driving circuit provided by an embodiment of the present disclosure, the first shift register unit further comprises a third noise reduction circuit; and the third noise reduction circuit is connected to the second node and the shift signal output terminal, and is configured to perform noise reduction on the second node under control of the shift signal.

For example, in the gate driving circuit provided by an embodiment of the present disclosure, the first input circuit comprises a first transistor, a gate electrode of the first transistor is connected to the first input terminal, a first electrode of the first transistor is connected to the first source signal terminal, and a second electrode of the first transistor is connected to the first node; the first reset circuit comprises a second transistor, a gate electrode of the second transistor is connected to the first reset terminal, a first electrode of the second transistor is connected to the first node, and a second electrode of the second transistor is connected to a first voltage terminal; the first initial reset circuit comprises a third transistor, a gate electrode of the third transistor is connected to the first initial reset terminal, a first electrode of the third transistor is connected to the first node, and a second electrode of the third transistor is connected to a second voltage terminal; the first control circuit comprises a fourth transistor and a fifth transistor, a gate electrode and a first electrode of the fourth transistor are connected to the second clock signal terminal, a second electrode of the fourth transistor is connected to the second node, a gate electrode of the fifth transistor is connected to the first node, a first electrode of the fifth transistor is connected to the second node, and a second electrode of the fifth transistor is connected to the second voltage terminal; the first output circuit comprises a sixth transistor, a seventh transistor, and a first capacitor, a gate electrode of the sixth transistor is connected to the first node, a first electrode of the sixth transistor is connected to the first clock signal terminal, a second electrode of the sixth transistor is connected to the shift signal output terminal, a gate electrode of the seventh transistor is connected to the first node, a first electrode of the seventh transistor is connected to the first clock signal terminal, a second electrode of the seventh transistor is connected to the first scanning signal output terminal, a first electrode of the first capacitor is connected to the first node, and a second electrode of the first capacitor is connected to the first scanning signal output terminal; the first noise reduction circuit comprises an eighth transistor, a ninth transistor, and a tenth transistor, a gate electrode of the eighth transistor is connected to the second node, a first electrode of the eighth transistor is connected to the first node, a second electrode of the eighth transistor is connected to the second voltage terminal, a gate electrode of the ninth transistor is connected to the second node, a first electrode of the ninth transistor is connected to the shift signal output terminal, a second electrode of the ninth transistor is connected to the second voltage terminal, a gate electrode of the tenth transistor is connected to the second node, a first electrode of the tenth transistor is connected to the first scanning signal output terminal, and a second electrode of the tenth transistor is connected to the second voltage terminal; and the third noise reduction circuit comprises an eleventh transistor, a gate electrode of the eleventh transistor is connected to the shift signal output terminal, a first electrode of the eleventh transistor is connected to the second node, and a second electrode of the eleventh transistor is connected to the second voltage terminal.

For example, in the gate driving circuit provided by an embodiment of the present disclosure, the second input circuit comprises a twelfth transistor, a gate electrode of the twelfth transistor is connected to the second input terminal, a first electrode of the twelfth transistor is connected to the second source signal terminal, and a second electrode of the twelfth transistor is connected to the third node; the second reset circuit comprises a thirteenth transistor, a gate electrode of the thirteenth transistor is connected to the second reset terminal, a first electrode of the thirteenth transistor is connected to the third node, and a second electrode of the thirteenth transistor is connected to a third voltage terminal; the second initial reset circuit comprises a fourteenth transistor, a gate electrode of the fourteenth transistor is connected to the second initial reset terminal, a first electrode of the fourteenth transistor is connected to the third node, and a second electrode of the fourteenth transistor is connected to a fourth voltage terminal; the second output circuit comprises a fifteenth transistor and a second capacitor, a gate electrode of the fifteenth transistor is connected to the third node, a first electrode of the fifteenth transistor is connected to the third clock signal terminal, a second electrode of the fifteenth transistor is connected to the second scanning signal output terminal, a first electrode of the second capacitor is connected to the third node, and a second electrode of the second capacitor is connected to the second scanning signal output terminal; and the second noise reduction circuit comprises a sixteenth transistor and a seventeenth transistor, a gate electrode of the sixteenth transistor is connected to the second node, a first electrode of the sixteenth transistor is connected to the third node, a second electrode of the sixteenth transistor is connected to a fourth voltage terminal, a gate electrode of the seventeenth transistor is connected to the second node, a first electrode of the seventeenth transistor is connected to the second scanning signal output terminal, and a second electrode of the seventeenth transistor is connected to the fourth voltage terminal.

At least one embodiment of the present disclosure further provides a display panel, which comprises the gate driving circuit provided by any embodiments of the present disclosure.

At least one embodiment of the present disclosure further provides a display device, which comprises the display panel provided by any embodiments of the present disclosure.

At least one embodiment of the present disclosure further provides a method for driving the gate driving circuit provided by any embodiments of the present disclosure. The method comprises: enabling a same group of shift register units to operate under control of a same second node, so as to output N signals which are sequentially shifted, thereby outputting M*N signals which are sequentially shifted by adopting the gate driving circuit.

BRIEF DESCRIPTION OF THE DRAWINGS

In order to clearly illustrate the technical solution of the embodiments of the present disclosure, the drawings of the embodiments will be briefly described in the following. It is obvious that the described drawings in the following are only related to some embodiments of the present disclosure and thus are not limitative of the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", "coupled", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In the field of display technologies, a gate driving circuit (e.g., GOA) composed of a plurality of cascaded shift register units may be adopted to supply an on-off voltage signal for a plurality of rows of gate lines of a pixel array, thereby controlling the plurality of rows of gate lines to be sequentially turned on, and meanwhile, data signals are supplied by data lines to pixel units of a corresponding row in the pixel array to form a grayscale voltage required for each grayscale of a displayed image in each pixel unit, so as to further display one frame of image. The gate driving circuit is an important component of a display device. In the gate driving circuit, each stage of shift register unit may be electrically connected with a trace (e.g., a gate line or an enable signal line) corresponding to a row of pixels in the display device. The gate driving circuit inputs scanning signals to a plurality of rows of traces row-by-row, so that the display device is capable of displaying images.

Figure 1:
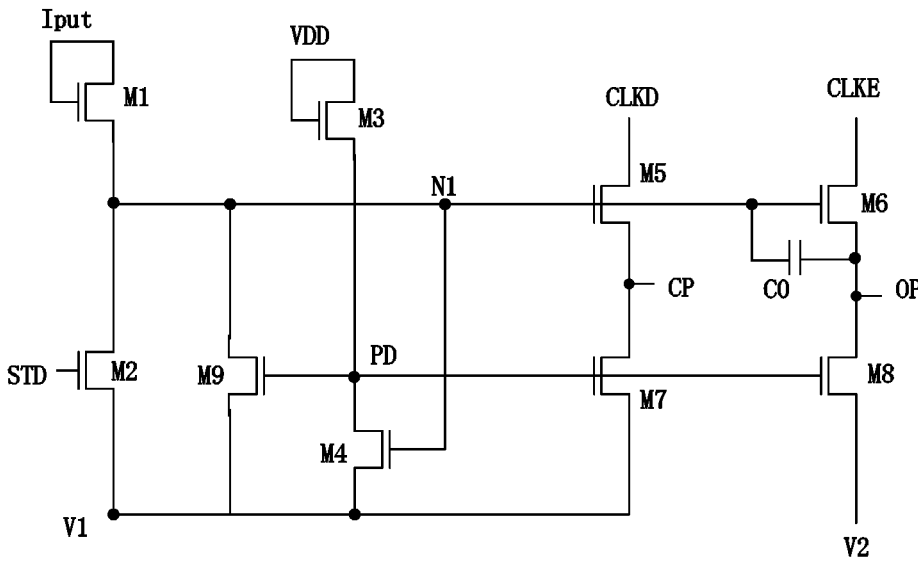
FIG. 1 is a schematic diagram of a circuit structure of a gate driving circuit.

Usually, a circuit structure of a shift register unit is illustrated in FIG. 1. The shift register unit includes transistors M1 to M9 and a storage capacitor C0. The transistor M5 outputs a shift signal CP under control of a node N1, the shift signal CP is used to cascade with other stage of shift register units. The transistor M6 outputs a scanning signal OP under control of the node N1, and the scanning signal OP is transmitted to a corresponding row of pixels to control the pixels to display. The transistors M7, M8 and M9 reset the shift signal CP, the scanning signal OP, and the node N1 under control of a node PD. In each stage of shift register unit, there is a node PD, and nodes PD of respective shift register units are independent of each other. This makes the circuit structure complex, with a large amount of transistors, a larger size of circuit layout, and complex timing.

At least one embodiment of the present disclosure provides a gate driving circuit and a driving method thereof, a display panel and a display device. The gate driving circuit can reduce the amount of transistors, simplify the circuit structure, and reduce the size of circuit layout, so that the circuit layout is simpler, and overall drive timing is more concise, which is suitable for medium-sized and large-sized display panels, is favorable for narrow frame design of large-sized display panels, and can directly implement change of display resolution by changing clock timing, so as to implement partition display.

Hereinafter, the embodiments of the present disclosure will be illustrated in detail with reference to the accompanying drawings. It should be noted that same reference signs in different diagrams will be used to refer to same components that have already been described.

At least one embodiment of the present disclosure provides a gate driving circuit. The gate driving circuit includes M groups of shift register units; each group of shift register units includes N shift register units; the N shift register units output N signals which are sequentially shifted; and the M groups of shift register units output M*N signals which are sequentially shifted, where M and N are positive integers. Each group of shift register units includes one first shift register unit and N−1 second shift register units. The first shift register unit includes a first input circuit, a first output circuit, a first control circuit and a first noise reduction circuit. The first input circuit is connected to a first input terminal, a first node, and a first source signal terminal, and is configured to write a first source signal of the first source signal terminal into the first node in response to a first input signal of the first input terminal, so as to control a level of the first node. The first output circuit is connected to the first node, a first clock signal terminal, a first scanning signal output terminal, and a shift signal output terminal, and is configured to receive a first clock signal of the first clock signal terminal, output a first scanning signal through the first scanning signal output terminal and output a shift signal through the shift signal output terminal under control of the level of the first node. The first control circuit is connected to the first node, a second clock signal terminal, and a second node, and is configured to control a level of the second node under control of the level of the first node and a second clock signal of the second clock signal terminal. The first noise reduction circuit is connected to the first node, the second node, the first scanning signal output terminal, and the shift signal output terminal, and is configured to perform noise reduction on the first node, the first scanning signal output terminal, and the shift signal output terminal, under control of the level of the second node. The second shift register unit includes a second input circuit, a second output circuit and a second noise reduction circuit. The second input circuit is connected to a second input terminal, a third node, and a second source signal terminal, and is configured to write a second source signal of the second source signal terminal into the third node in response to a second input signal of the second input terminal, so as to control a level of the third node. The second output circuit is connected to the third node, a third clock signal terminal, and a second scanning signal output terminal, and is configured to receive a third clock signal of the third clock signal terminal, and output a second scanning signal through the second scanning signal output terminal under control of the level of the third node. The second noise reduction circuit is connected to the second node, the third node, and the second scanning signal output terminal, and is configured to perform noise reduction on the third node and the second scanning signal output terminal under control of the level of the second node. In a same group of shift register units, the first shift register unit and the second shift register units share a same second node; and a first input signal received by the first shift register unit and a second input signal received by the second shift register units are a same signal. A first input signal and a second input signal received by a Kth group of shift register units are the shift signal output by a first shift register unit in a (K−2)th group of shift register units, where $3 \leq K \leq M$ and K is an integer.

Figure 2:
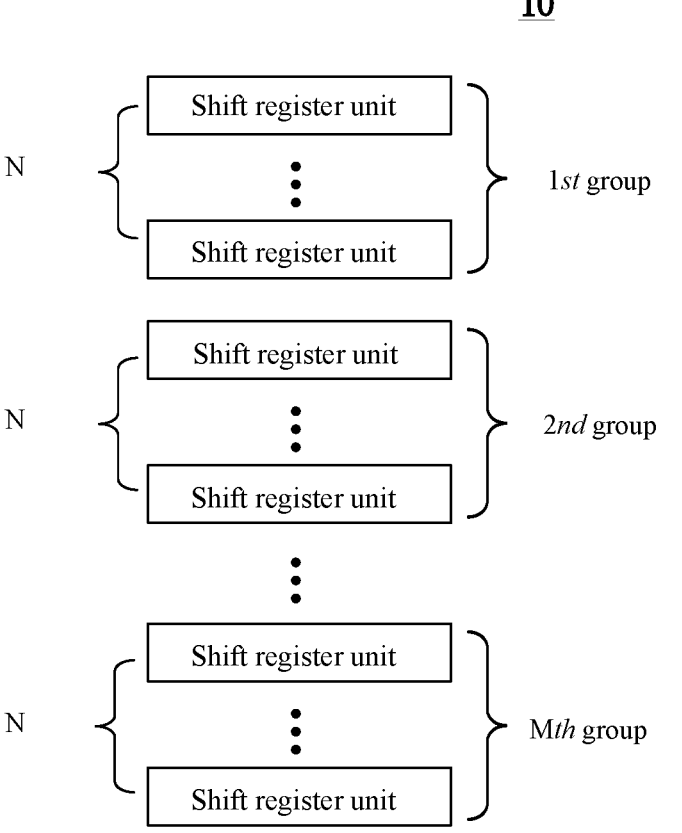
FIG. 2 is a schematic block diagram of a gate driving circuit provided by some embodiments of the present disclosure.

FIG. 2 is a schematic block diagram of a gate driving circuit provided by some embodiments of the present disclosure. As illustrated in FIG. 2, the gate driving circuit 10 includes M groups of shift register units; and each group of shift register units includes N shift register units. N shift register units output N signals that are sequentially shifted. The M groups of shift register units included in the gate driving circuit 10 output M*N signals that are sequentially shifted. M and N are positive integers. For example, each group of shift register units includes one first shift register unit and N−1 second shift register unit. The first shift register unit is different from the second shift register unit, for example, circuit structures of the two are different. That is to say, in each group of N shift register units, there is one first shift register unit, and the remaining N−1 shift register units are all second shift register units. Here, the first shift register unit does not indicate that this shift register unit is ranked in a first position, nor does the second shift register unit indicate that this shift register unit is ranked in a second position. "First" and "second" here are only used to distinguish between these two types of shift register units, and do not represent any order, position, importance, etc.

Figure 3:
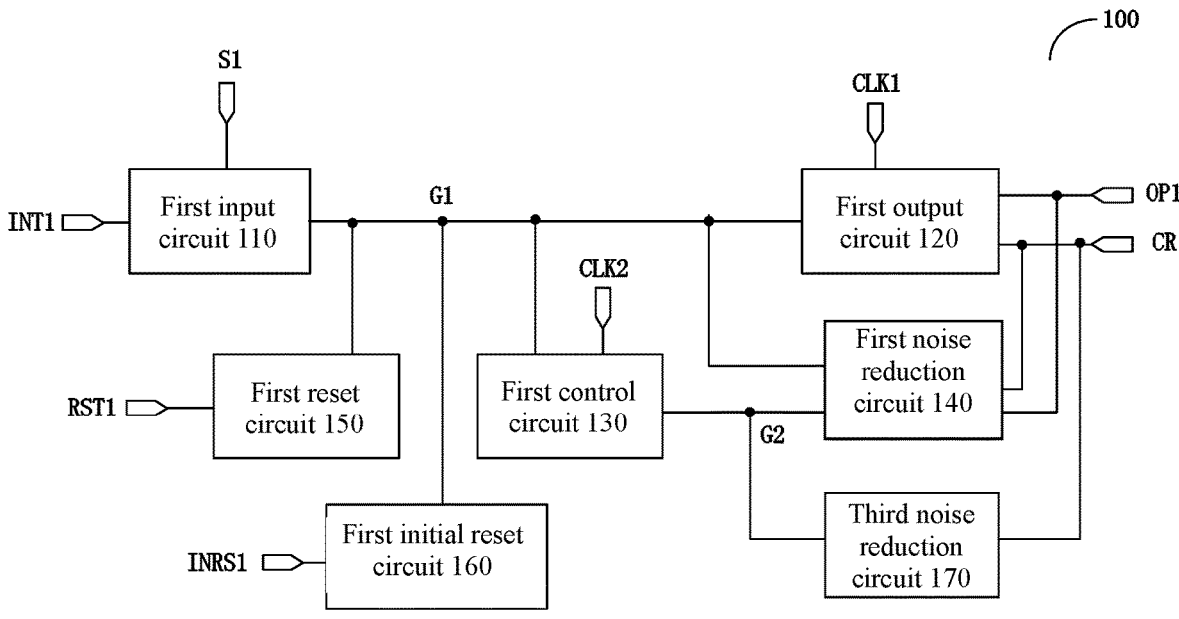
FIG. 3 is a schematic block diagram of a first shift register unit in the gate driving circuit provided by some embodiments of the present disclosure.

FIG. 3 is a schematic block diagram of a first shift register unit in the gate driving circuit provided by some embodiments of the present disclosure. As illustrated in FIG. 3, the first shift register unit 100 includes a first input circuit 110, a first output circuit 120, a first control circuit 130, and a first noise reduction circuit 140.

The first input circuit 110 is connected to a first input terminal INT1, a first node G1, and a first source signal terminal S1, and is configured to write a first source signal of the first source signal terminal S1 into the first node G1 in response to a first input signal of the first input terminal INT1, so as to control a level of the first node G1. For example, the first input circuit 110 electrically connects the first node G1 and the first source signal terminal S1 under control of the first input signal, so that a high level of the first source signal charges the first node G1, and a level of the first node G1 boosts to control the first output circuit 120 to be turned on. In other embodiments, a low level of the first source signal may also discharge the first node G1, so that the level of the first node G1 bucks, so as to control the first output circuit 120 to be turned on; the change mode (i.e., boost or buck) of the level of the first node G1 may be determined according to specific implementations of the first output circuit 120, for example, determined according to a type of transistors adopted. For example, the first node G1 may be a pull-up node.

The first output circuit 120 is connected to the first node G1, a first clock signal terminal CLK1, a first scanning signal output terminal OP1, and a shift signal output terminal CR, and is configured to receive a first clock signal of the first clock signal terminal CLK1, output a first scanning signal through the first scanning signal output terminal OP1 and output a shift signal through the shift signal output terminal CR under control of the level of the first node G1. For example, the first output circuit 120 is turned on under control of the level of the first node G1, so that the first clock signal terminal CLK1 is respectively electrically connected with the first scanning signal output terminal OP1 and the shift signal output terminal CR; so, after receiving the first clock signal, the first output circuit 120 may output the first scanning signal through the first scanning signal output terminal OP1, and output the shift signal through the shift signal output terminal CR. The first scanning signal, as an output signal of the shift register unit 100, is used to drive, for example, a gate line of a display panel connected with the first scanning signal output terminal OP1. The shift signal may be supplied to other stage of shift register units cascaded with this shift register unit 100.

The first control circuit 130 is connected to the first node G1, a second clock signal terminal CLK2, and a second node G2, and is configured to control a level of the second node G2 under control of the level of the first node G1 and a second clock signal of the second clock signal terminal CLK2. For example, the first control circuit 130 is connected to the first node G1, the second node G2, the second clock signal terminal CLK2, and a second voltage terminal VGL2 (not illustrated in FIG. 3), and is configured to pull up a potential of the second node G2 when the second clock signal supplied by the second clock signal terminal CLK2 is at a high level, and pull down the potential of the second node G2 when the first node G1 is at a high level. For example, the second node G2 may be a pull-down node.

The first noise reduction circuit 140 is connected to the first node G1, the second node G2, the first scanning signal output terminal OP1, and the shift signal output terminal CR, and is configured to perform noise reduction on the first node G1, the first scanning signal output terminal OP1, and the shift signal output terminal CR under control of the level of the second node G2. For example, the first noise reduction circuit 140 is respectively connected with the first node G1, the second node G2, the first scanning signal output terminal OP1, and the shift signal output terminal CR. When the second node G2 is at a high level, the first node G1 is electrically connected to a second voltage terminal VGL2 (not illustrated in FIG. 3), the first scanning signal output terminal OP1 is electrically connected to the second voltage terminal VGL2, and the shift signal output terminal CR is electrically connected to the second voltage terminal VGL2. Because the second voltage terminal VGL2 supplies a low voltage, noise reduction can be performed on the first node G1, the first scanning signal output terminal OP1, and the shift signal output terminal CR.

For example, in some examples, the first shift register unit 100 may further include a first reset circuit 150, a first initial reset circuit 160, and a third noise reduction circuit 170.

The first reset circuit 160 is connected to a first reset terminal RST1 and the first node G1, and is configured to reset the first node G1 in response to a first reset signal of the first reset terminal RST1. For example, the first reset circuit 150 is connected to the first node G1, the first reset terminal RST1, and a first voltage terminal VGL1 (not illustrated in FIG. 3), and is configured to electrically connect the first node G1 and the first voltage terminal VGL1 under control of the first reset signal supplied by the first reset terminal RST1, so as to reset the first node G1 with a low voltage supplied by the first voltage terminal VGL1. For example, the first reset circuit 150 resets the first node G1 after output of the first shift register unit 100 is ended.

The first initial reset circuit 160 is connected to a first initial reset terminal INRS1 and the first node G1, and is configured to reset the first node G1 in response to a first initial reset signal of the first initial reset terminal INRS1. For example, the first initial reset circuit 160 is connected to the first node G1, the first initial reset terminal INRS1, and the first voltage terminal VGL1, and is configured to electrically connect the first node G1 and the first voltage terminal VGL1 under control of the first initial reset signal supplied by the first initial reset terminal INRS1, so as to reset the first node G1 with a low voltage supplied by the first voltage terminal VGL1. For example, the first initial reset circuit 160 resets the first node G1 before start of displaying a frame.

The third noise reduction circuit 170 is connected to the second node G2 and the shift signal output terminal CR, and is configured to perform noise reduction on the second node G2 under control of the shift signal. For example, the third noise reduction circuit 170 is connected to the second node G2 and the shift signal output terminal CR. When the shift signal output from the shift signal output terminal CR is at a high level, the second node G2 is electrically connected to the second voltage terminal VGL2. Because the second voltage terminal VGL2 supplies a low voltage, noise reduction can be performed on the second node G2.

Figure 4:
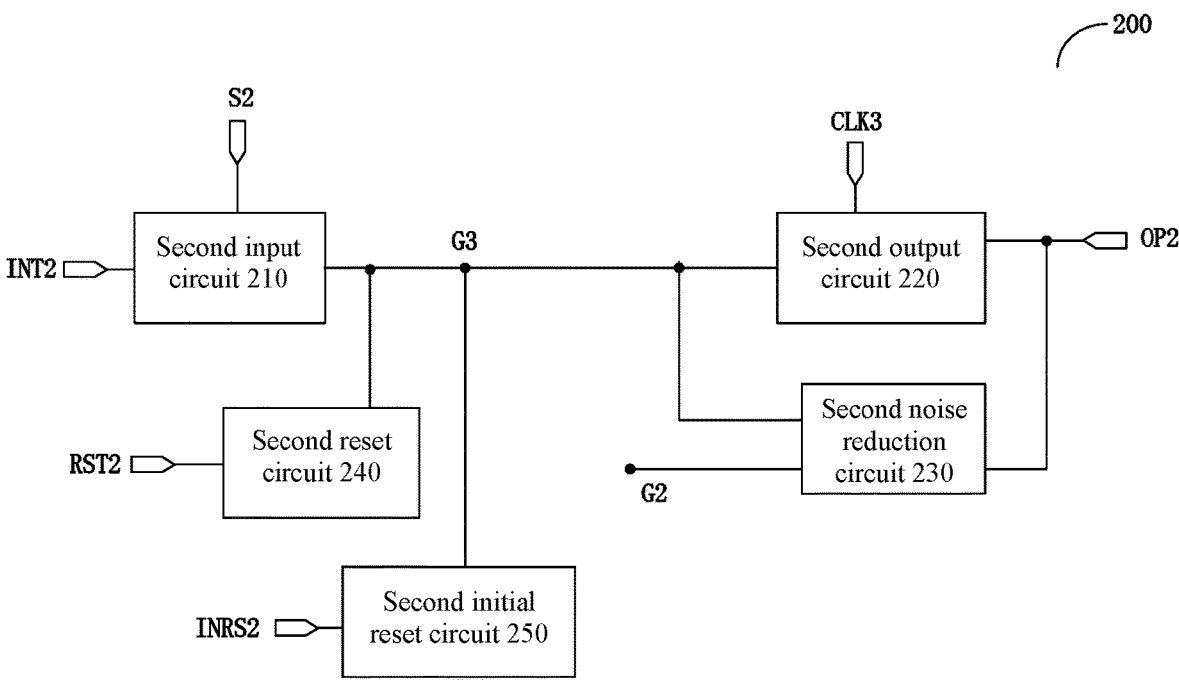
FIG. 4 is a schematic block diagram of a second shift register unit in the gate driving circuit provided by some embodiments of the present disclosure.

FIG. 4 is a schematic block diagram of a second shift register unit in the gate driving circuit provided by some embodiments of the present disclosure. As illustrated in FIG. 4, a second shift register unit 200 includes a second input circuit 210, a second output circuit 220, and a second noise reduction circuit 230.

The second input circuit 210 is connected to a second input terminal INT2, a third node G3, and a second source signal terminal S2, and is configured to write a second source signal of the second source signal terminal S2 into the third node G3 in response to a second input signal of the second input terminal INT2, so as to control a level of the third node G3. For example, the second input circuit 210 electrically connects the third node G3 and the second source signal terminal S2 under control of the second input signal, so that a high level of the second source signal charges the third node G3 and a level of the third node G3 boosts to control the second output circuit 220 to be turned on. In other embodiments, a low level of the second source signal may also discharge the third node G3, so that the level of the third node G3 bucks to control the second output circuit 220 to be turned on. The change mode (i.e., boost or buck) of the level of the third node G3 may be determined according to specific implementations of the second output circuit 220, for example, determined according to a type of transistors adopted. For example, the third node G3 may be a pull-up node.

The second output circuit 220 is connected to the third node G3, a third clock signal terminal CLK3, and a second scanning signal output terminal OP2, and is configured to receive a third clock signal of the third clock signal terminal CLK3, and output a second scanning signal through the second scanning signal output terminal OP2 under control of the level of the third node G3. For example, the second output circuit 220 is turned on under control of the level of the third node G3, and electrically connects the third clock signal terminal CLK3 and the second scanning signal output terminal OP2; so, after receiving the third clock signal, the second output circuit 220 may output the second scanning signal through the second scanning signal output terminal OP2. The second scanning signal, as an output signal of this shift register unit 200, is used to drive, for example, a gate line of a display panel connected with the second scanning signal output terminal OP2. It should be noted that the second output circuit 220 does not need to output a shift signal as the first output circuit 120.

The second noise reduction circuit 230 is connected to the second node G2, the third node G3, and the second scanning signal output terminal OP2, and is configured to perform noise reduction on the third node G3 and the second scanning signal output terminal OP2 under control of the level of the second node G2. For example, the second noise reduction circuit 230 is respectively connected with the third node G3, the second node G2, and the second scanning signal output terminal OP2. When the second node G2 is at a high level, the third node G3 is electrically connected to a fourth voltage terminal VGL4 (not illustrated in FIG. 4), and the second scanning signal output terminal OP2 is electrically connected to the fourth voltage terminal VGL4. Because the fourth voltage terminal VGL4 supplies a low voltage, noise reduction can be performed on the third node G3 and the second scanning signal output terminal OP2.

For example, the second node G2 in the second shift register unit 200 and the second node G2 in the first shift register unit 100 which belongs to a same group of shift register units with the second shift register unit 200 are a same node. That is, in the same group of shift register units, the first shift register unit 100 and the second shift register units 200 share the same second node G2, and second nodes G2 of the N shift register units are connected with each other. The first shift register unit 100 is provided therein with a first control circuit 130 to control a level of the second node G2, so there is no need to provide a control circuit for controlling the level of the second node G2 in the second shift register unit 200. The second node G2 in the second shift register unit 200 can be coupled to the second node G2 in the first shift register unit 100 through a trace, so that the second node G2 is multiplexed, which simplifies the circuit structure of the second shift register unit 200.

For example, in some examples, the second shift register unit 200 may further include a second reset circuit 240 and a second initial reset circuit 250.

The second reset circuit 240 is connected to a second reset terminal RST2 and the third node G3, and is configured to reset the third node G3 in response to a second reset signal of the second reset terminal RST2. For example, the second reset circuit 240 is connected to the third node G3, the second reset terminal RST2, and a third voltage terminal VGL3 (not illustrated in FIG. 4), and is configured to electrically connect the third node G3 and the third voltage terminal VGL3 under control of the second reset signal supplied by the second reset terminal RST2, so as to reset the third node G3 with a low voltage of the third voltage terminal VGL3. For example, the second reset circuit 240 resets the third node G3 after output of the second shift register unit 200 is ended.

The second initial reset circuit 250 is connected to a second initial reset terminal INRS2 and the third node G3, and is configured to reset the third node G3 in response to a second initial reset signal of the second initial reset terminal INRS2. For example, the second initial reset circuit 250 is connected to the third node G3, the second initial reset terminal INRS2, and a fourth voltage terminal VGL4 (not illustrated in FIG. 4), and is configured to electrically connect the third node G3 and the fourth voltage terminal VGL4 under control of the second initial reset signal supplied by the second initial reset terminal INRS2, so as to reset the third node G3 with a low voltage of the fourth voltage terminal VGL4. For example, the second initial reset circuit 250 resets the third node G3 before start of displaying a frame.

For example, in a same group of shift register units, the first input signal received by the first shift register unit 100 (i.e., the first input signal received by the first input circuit 110 through the first input terminal INT1) and the second input signal received by the second shift register unit 200 (i.e., the second input signal received by the second input circuit 210 through the second input terminal INT2) are a same signal. For example, in the same group of shift register units, the first reset signal received by the first shift register unit 100 (i.e., the first reset signal received by the first reset circuit 150 through the first reset terminal RST1) and the second reset signal received by the second shift register unit 200 (i.e., the second reset signal received by the second reset circuit 240 through the second reset terminal RST2) are a same signal. For example, in some examples, the first initial reset signal received by the first shift register unit 100 (i.e., the first initial reset signal received by the first initial reset circuit 160 through the first initial reset terminal INRS1) and the second initial reset signal received by the second shift register unit 200 (i.e., the second initial reset signal received by the second initial reset circuit 250 through the second initial reset terminal INRS2) are a same signal. Therefore, it is convenient to implement functions of respective shift register units in the case of multiplexing the second node G2 in the same group of shift register units.

It should be noted that in the embodiments of the present disclosure, the first voltage terminal VGL1, the second voltage terminal VGL2, the third voltage terminal VGL3, and the fourth voltage terminal VGL4 may all be configured to keep inputting direct-current low-level signals; and the corresponding direct-current low levels are respectively referred to as a first voltage, a second voltage, a third voltage, and a fourth voltage. For example, in some examples, the first voltage is the same as the third voltage, the second voltage is the same as the fourth voltage, and the first voltage is different from the second voltage, that is, the first voltage terminal VGL1 and the third voltage terminal VGL3 are a same low voltage terminal, the second voltage terminal VGL2 and the fourth voltage terminal VGL4 are a same low voltage terminal, and the first voltage terminal VGL1 and the second voltage terminal VGL2 are different low voltage terminals. For example, in other examples, the first voltage, the second voltage, the third voltage, and the fourth voltage may be the same, that is, the first voltage terminal VGL1, the second voltage terminal VGL2, the third voltage terminal VGL3, and the fourth voltage terminal VGL4 are a same low voltage terminal.

Figure 5:
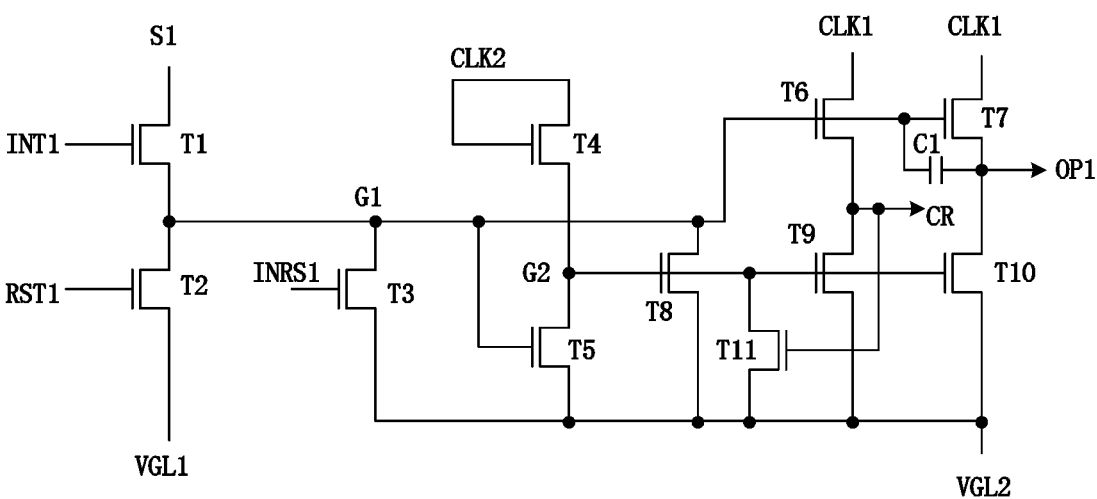
FIG. 5 is a schematic diagram of a circuit structure of a first shift register unit in the gate driving circuit provided by some embodiments of the present disclosure.

FIG. 5 is a schematic diagram of a circuit structure of the first shift register unit in the gate driving circuit provided by some embodiments of the present disclosure. The circuit structure illustrated in FIG. 5, for example, is a specific implementation of the first shift register unit 100 illustrated in FIG. 3. Hereinafter, it will be illustrated by taking the respective transistors as N-type transistors; but this does not constitute a limitation on the embodiments of the present disclosure. As illustrated in FIG. 5, the first shift register unit 100 includes a first transistor T1 to an eleventh transistor T11 and a first capacitor C1.

The first input circuit 110 may be implemented as a first transistor T1; a gate electrode of the first transistor T1 is connected to the first input terminal INT1; a first electrode of the first transistor T1 is connected to the first source signal terminal S1; and a second electrode of the first transistor T1 is connected to the first node G1. When the first input signal of the first input terminal INT1 is at an active level (e.g., a high level), the first transistor T1 is turned on, and the first source signal of the first source signal terminal S1 charges the first node G1, so that the first node G1 is at a high level.

The first reset circuit 150 may be implemented as a second transistor T2; a gate electrode of the second transistor T2 is connected to the first reset terminal RST1; a first electrode of the second transistor T2 is connected to the first node G1; and a second electrode of the second transistor T2 is connected to the first voltage terminal VGL1. When the first reset signal of the first reset terminal RST1 is at an active level (e.g., a high level), the second transistor T2 is turned on and electrically connects the first node G1 and the first voltage terminal VGL1, so as to reset the first node G1.

The first initial reset circuit 160 may be implemented as a third transistor T3; a gate electrode of the third transistor T3 is connected to the first initial reset terminal INRS1; a first electrode of the third transistor T3 is connected to the first node G1; and a second electrode of the third transistor T3 is connected to the second voltage terminal VGL2. When the first initial reset signal of the first initial reset terminal INRS1 is at an active level (e.g., a high level), the third transistor T3 is turned on and electrically connects the first node G1 and the second voltage terminal VGL2, so as to reset the first node G1.

The first control circuit 130 may be implemented as a fourth transistor T4 and a fifth transistor T5. A gate electrode and a first electrode of the fourth transistor T4 are connected with the second clock signal terminal CLK2; and a second electrode of the fourth transistor T4 is connected to the second node G2. A gate electrode of the fifth transistor T5 is connected to the first node G1; a first electrode of the fifth transistor T5 is connected to the second node G2; and a second electrode of the fifth transistor T5 is connected to the second voltage terminal VGL2. When the second clock signal supplied by the second clock signal terminal CLK2 is at an active level (e.g., a high level), the fourth transistor T4 is turned on, and the second clock signal charges the second node G2, so that the second node G2 is at a high level. When the first node G1 is at an active level (e.g., a high level), the fifth transistor T5 is turned on and electrically connects the second node G2 and the second voltage terminal VGL2, so as to pull down the second node G2 to a low level.

The first output circuit 120 may be implemented as a sixth transistor T6, a seventh transistor T7, and a first capacitor C1. A gate electrode of the sixth transistor T6 is connected to the first node G1; a first electrode of the sixth transistor T6 is connected to the first clock signal terminal CLK1; and a second electrode of the sixth transistor T6 is connected to the shift signal output terminal CR. A gate electrode of the seventh transistor T7 is connected to the first node G1; a first electrode of the seventh transistor T7 is connected to the first clock signal terminal CLK1; and a second electrode of the seventh transistor T7 is connected to the first scanning signal output terminal OP1. A first electrode of the first capacitor C1 is connected to the first node G1; and a second electrode of the first capacitor C1 is connected to the first scanning signal output terminal OP1. When the first node G1 is at an active level (e.g., a high level), the sixth transistor T6 and seventh transistor T7 are turned on, so that the sixth transistor T6 and seventh transistor T7 can receive the first clock signal from the first clock signal terminal CLK1, thereby outputting the first scanning signal through the first scanning signal output terminal OP1 and outputting the shift signal through the shift signal output terminal CR.

The first noise reduction circuit 140 may be implemented as an eighth transistor T8, a ninth transistor T9, and a tenth transistor T10. A gate electrode of the eighth transistor T8 is connected to the second node G2; a first electrode of the eighth transistor T8 is connected to the first node G1; and a second electrode of the eighth transistor T8 is connected to the second voltage terminal VGL2. A gate electrode of the ninth transistor T9 is connected to the second node G2; a first electrode of the ninth transistor T9 is connected to the shift signal output terminal CR; and a second electrode of the ninth transistor T9 is connected to the second voltage terminal VGL2. A gate electrode of the tenth transistor T10 is connected to the second node G2; a first electrode of the tenth transistor T10 is connected to the first scanning signal output terminal OP1; and a second electrode of the tenth transistor T10 is connected to the second voltage terminal VGL2. When the second node G2 is at an active level (e.g., a high level), the eighth transistor T8, the ninth transistor T9, and the tenth transistor T10 are all turned on, respectively connecting the first node G1 and the second voltage terminal VGL2, connecting the shift signal output terminal CR and the second voltage terminal VGL2, and connecting the first scanning signal output terminal OP1 and the second voltage terminal VGL2, so that the first node G1, the shift signal, and the first scanning signal can be pulled down to a low level for noise reduction.

The third noise reduction circuit 170 may be implemented as an eleventh transistor T11; a gate electrode of the eleventh transistor T11 is connected to the shift signal output terminal CR; a first electrode of the eleventh transistor T11 is connected to the second node G2; and a second electrode of the eleventh transistor T11 is connected to the second voltage terminal VGL2. When the shift signal output from the shift signal output terminal CR is at an active level (e.g., a high level), the eleventh transistor T11 is turned on, connecting the second node G2 and the second voltage terminal VGL2, so that the second node G2 can be pulled down to a low level for noise reduction.

Figure 6:
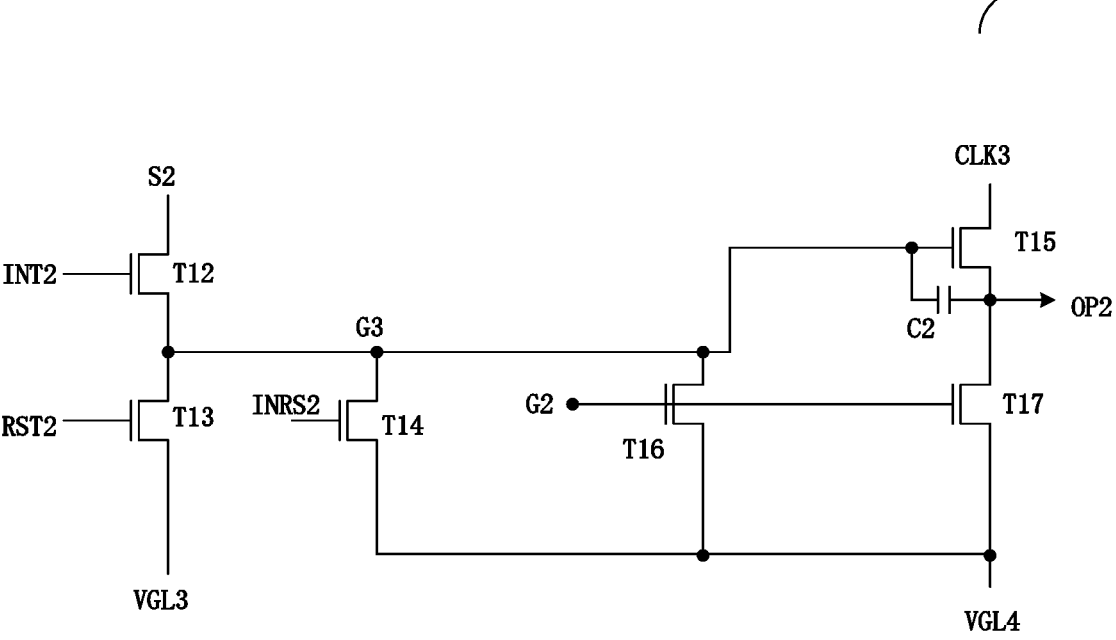
FIG. 6 is a schematic diagram of a circuit structure of a second shift register unit in the gate driving circuit provided by some embodiments of the present disclosure.

FIG. 6 is a schematic diagram of a circuit structure of the second shift register unit in the gate driving circuit provided by some embodiments of the present disclosure. The circuit structure illustrated in FIG. 6, for example, is a specific implementation of the second shift register unit 200 illustrated in FIG. 4. Hereinafter, it will be illustrated by taking the respective transistors as N-type transistors; but this does not constitute a limitation on the embodiments of the present disclosure. As illustrated in FIG. 6, the second shift register unit 200 includes a twelfth transistor T12 to a seventeenth transistor T17 and a second capacitor C2.

The second input circuit 210 may be implemented as a twelfth transistor T12; a gate electrode of the twelfth transistor T12 is connected to the second input terminal INT2; a first electrode of the twelfth transistor T12 is connected to the second source signal terminal S2; and a second electrode of the twelfth transistor T12 is connected to the third node G3. When the second input signal of the second input terminal INT2 is at an active level (e.g., a high level), the twelfth transistor T12 is turned on, and the second source signal of the second source signal terminal S2 charges the third node G3, so that the third node G3 is at a high level.

The second reset circuit 240 may be implemented as a thirteenth transistor T13; a gate electrode of the thirteenth transistor T13 is connected to the second reset terminal RST2; a first electrode of the thirteenth transistor T13 is connected to the third node G3; and a second electrode of the thirteenth transistor T13 is connected to the third voltage terminal VGL3. When the second reset signal of the second reset terminal RST2 is at an active level (e.g., a high level), the thirteenth transistor T13 is turned on, electrically connecting the third node G3 and the third voltage terminal VGL3, so as to reset the third node G3.

The second initial reset circuit 250 may be implemented as a fourteenth transistor T14; a gate electrode of the fourteenth transistor T14 is connected to the second initial reset terminal INRS2; a first electrode of the fourteenth transistor T14 is connected to the third node G3; and a second electrode of the fourteenth transistor T14 is connected to the fourth voltage terminal VGL4. When the second initial reset signal of second initial reset terminal INRS2 is at an active level (e.g., a high level), the fourteenth transistor T14 is turned on, electrically connecting the third node G3 and the fourth voltage terminal VGL4, so as to reset the third node G3.

The second output circuit 220 may be implemented as a fifteenth transistor T15 and the second capacitor C2. A gate electrode of the fifteenth transistor T15 is connected to the third node G3; a first electrode of the fifteenth transistor T15 is connected to the third clock signal terminal CLK3; and a second electrode of the fifteenth transistor T15 is connected to the second scanning signal output terminal OP2. A first electrode of the second capacitor C2 is connected to the third node G3; and a second electrode of the second capacitor C2 is connected to the second scanning signal output terminal OP2. When the third node G3 is at an active level (e.g., a high level), the fifteenth transistor T15 is turned on, so that the fifteenth transistor T15 can receive the third clock signal from the third clock signal terminal CLK3, and output the second scanning signal through the second scanning signal output terminal OP2.

The second noise reduction circuit 230 may be implemented as a sixteenth transistor T16 and a seventeenth transistor T17. A gate electrode of the sixteenth transistor T16 is connected to the second node G2; a first electrode of the sixteenth transistor T16 is connected to the third node G3; and a second electrode of the sixteenth transistor T16 is connected to the fourth voltage terminal VGL4. A gate electrode of the seventeenth transistor T17 is connected to the second node G2; a first electrode of the seventeenth transistor T17 is connected to the second scanning signal output terminal OP2; and a second electrode of the seventeenth transistor T17 is connected to the fourth voltage terminal VGL4. When the second node G2 is at an active level (e.g., a high level), both the sixteenth transistor T16 and the seventeenth transistor T17 are turned on, respectively connecting the third node G3 and the fourth voltage terminal VGL4, and connecting the second scanning signal output terminal OP2 and the fourth voltage terminal VGL4, so that the third node G3 and the second scanning signal can be pulled down to a low level for noise reduction. Here, the second node G2 of the second shift register unit 200 is coupled to the second node G2 of the first shift register unit 100 which belongs to the same group of shift register units as the second shift register unit 200.

It should be noted that in the respective embodiments of the present disclosure, the first capacitor C1, the second capacitor C2, and the storage capacitor C0 may be capacitor devices made through a fabrication process, for example, the capacitor device is implemented by fabricating specialized capacitor electrodes; respective electrodes of the capacitor may be implemented through metal layers, semiconductor layers (e.g., doped polysilicon), etc.; and the first capacitor C1, the second capacitor C2, and the storage capacitor C0 may also be parasitic capacitors between transistors, which may be implemented through the transistors per se as well as other devices and lines.

It should be noted that in the illustration of the respective embodiments of the present disclosure, the first node G1, the second node G2, the third node G3, the node N1, and the node PD do not represent actual components, but rather represent junction points of relevant electrical connections in the circuit diagrams.

It should be noted that the transistors adopted in the embodiments of the present disclosure may all be thin film transistors, field-effect transistors, or other switching devices with same characteristics. The embodiments of the present disclosure are all illustrated by taking thin film transistors as an example. The transistor used here may have a source electrode and a drain electrode that are symmetrical in structure, so there is no difference in structure between the source electrode and the drain electrode. In the embodiments of the present disclosure, in order to distinguish the two electrodes of the transistor except for the gate electrode, one electrode is directly described as the first electrode and the other electrode as the second electrode.

In addition, the embodiments of the present disclosure are all illustrated by taking the transistors as N-type transistors, in this case, a first electrode of the transistor is a drain electrode and a second electrode is a source electrode. It should be noted that the present disclosure includes but is not limited thereto. For example, one or more transistors in the shift register unit provided by the embodiments of the present disclosure may also be P-type transistors, in this case, a first electrode of the transistor is a source electrode and a second electrode is a drain electrode; it is only necessary to correspondingly connect the respective electrodes of the selected type of transistors with reference to the respective electrodes of the corresponding electrodes according to the embodiments of the present disclosure, and make the corresponding voltage terminal to supply corresponding high or low voltage. When N-type transistors are adopted, an active layer of the thin-film transistor may be made of indium gallium zinc oxide (IGZO), which, as compared with the case where the active layer of the thin-film transistor is made of low temperature poly silicon (LTPS) or amorphous silicon (e.g., hydrogenated amorphous silicon), may effectively reduce the size of the transistor and prevent current leakage.

In the embodiments of the present disclosure, for example, when the respective circuits are implemented as N-type transistors, the term "pull up" indicates charging a node or an electrode of a transistor to increase an absolute value of a level of the node or the electrode, so as to implement an operation (e.g., turning on) on the corresponding transistor; "pull down" indicates discharging a node or an electrode of a transistor to reduce an absolute value of a level of the node or the electrode, so as to implement an operation (e.g., turning off) on the corresponding transistor. For another example, when the respective circuits are implemented as P-type transistors, the term "pull down" indicates discharging a node or an electrode of a transistor to reduce an absolute value of a level of the node or the electrode, so as to implement an operation (e.g., turning on) on the corresponding transistor; "pull up" indicates charging a node or an electrode of a transistor to increase an absolute value of a level of the node or the electrode, so as to implement an operation (e.g., turning off) on the corresponding transistor.

Figure 7:
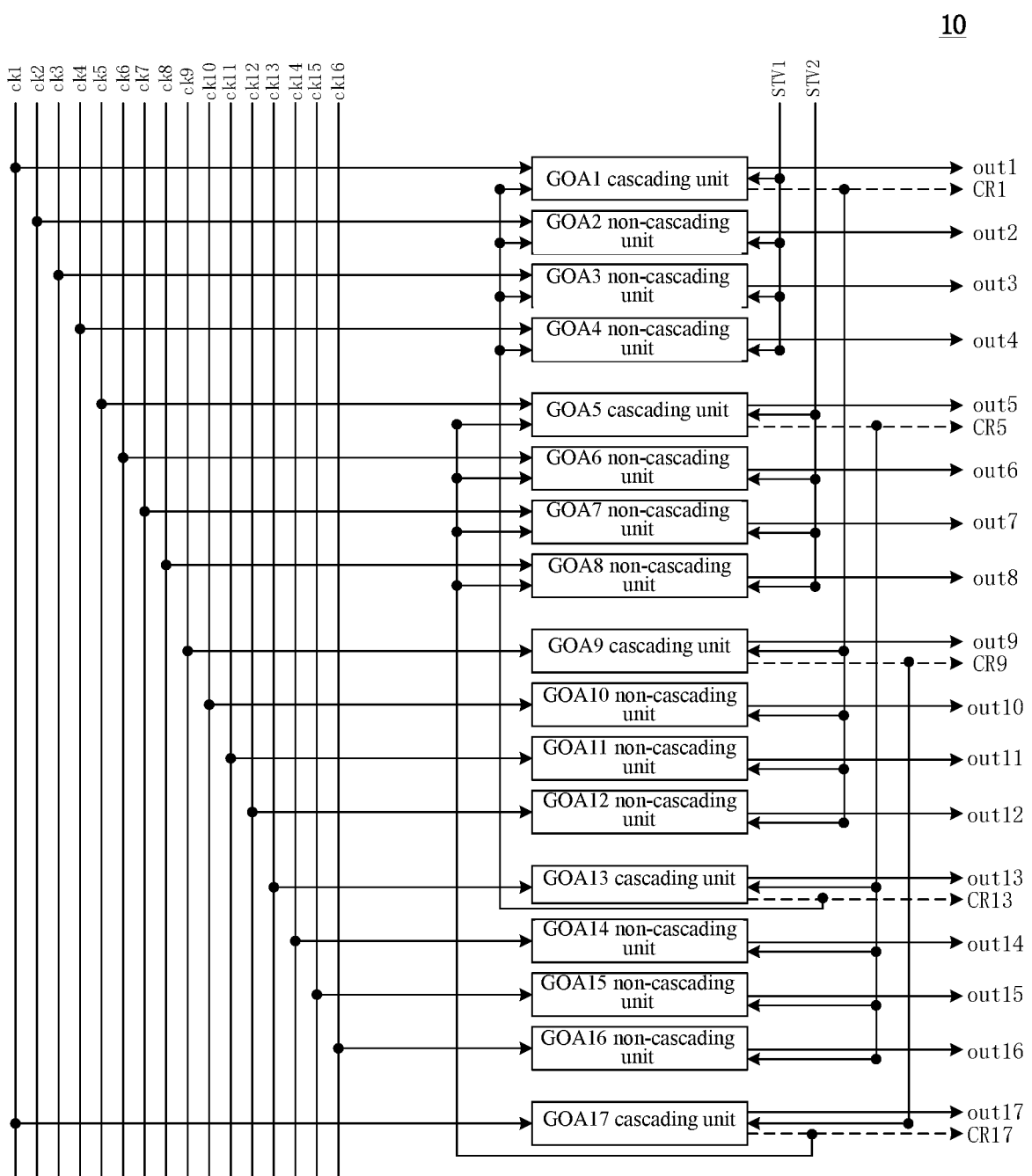
FIG. 7 is a schematic diagram of a cascade relationship of the gate driving circuit provided by some embodiments of the present disclosure.

FIG. 7 is a schematic diagram of a cascade relationship of the gate driving circuit provided by some embodiments of the present disclosure. As illustrated in FIG. 7, in this embodiment, N=4, that is, the amount of shift register units in each group is 4, where, 1 shift register unit is the first shift register unit and 3 shift register units are second shift register units. In the gate driving circuit 10, every 4 rows of shift register units share one second node G2. The gate driving circuit 10 is connected to 16 clock lines; and the 16 clock lines include a 1st clock line ck1 to a 16th clock line ck16.

For example, each group of shift register units is numbered in an order of the first shift register unit, a first one second shift register unit, a second one second shift register unit, and a third one second shift register unit. The M groups of shift register units are numbered sequentially, so that 4*M shift register units contained in the gate driving circuit 10 are sequentially numbered as a 1st shift register unit to a (4*M)th shift register unit. For example, a (4X+1)th shift register unit is the foregoing first shift register unit 100, a (4X+2)th shift register unit, a (4X+3)th shift register unit, and a (4X+4)th shift register unit are the foregoing second shift register units 200, where X≥0 and X is an integer.

Figure 8:
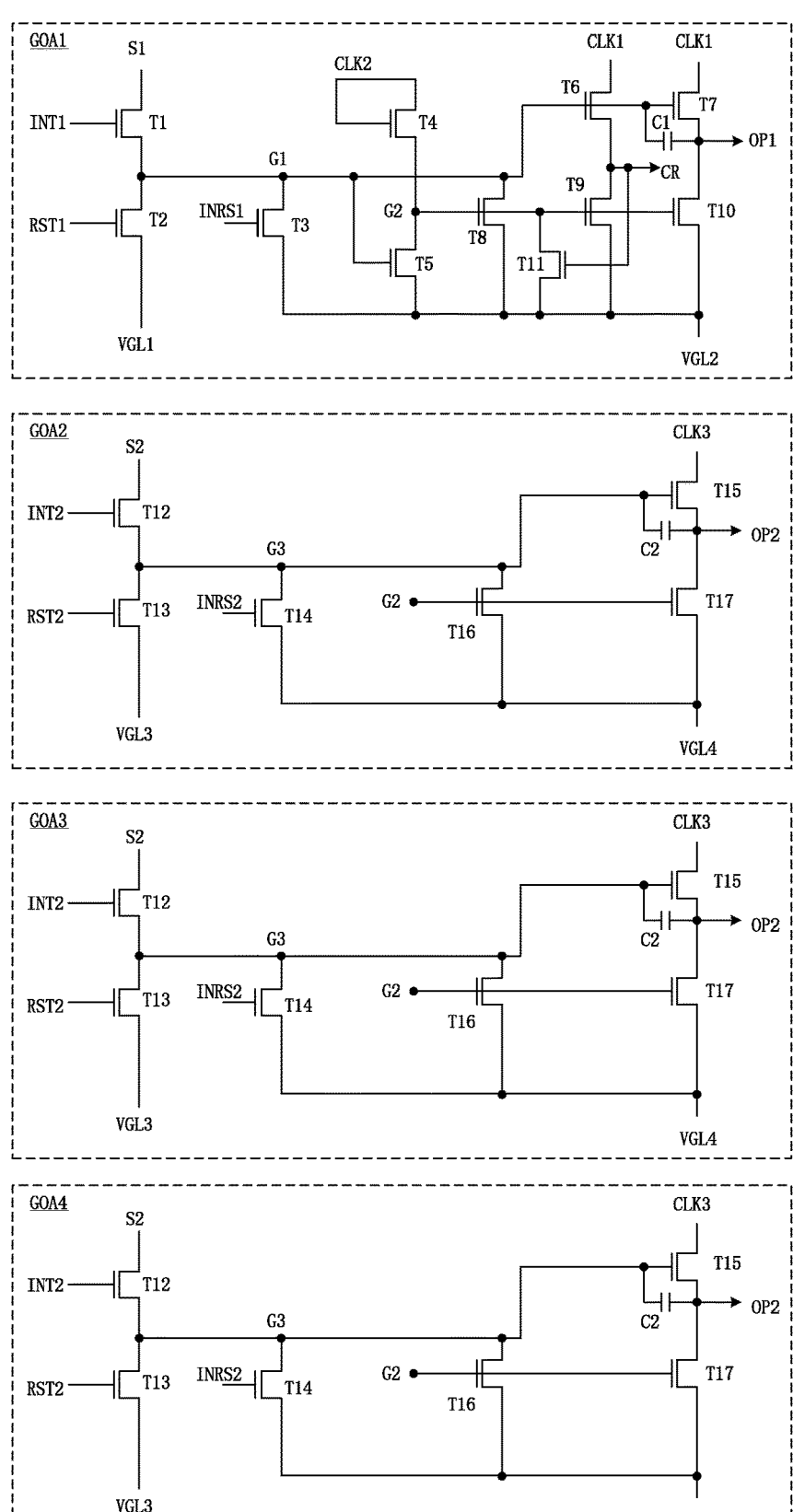
FIG. 8 is a schematic diagram of a circuit structure of one group of shift register units in the gate driving circuit illustrated in FIG. 7.

For example, as illustrated in FIG. 7, GOA1 to GOA4 belong to a 1st group, GOA5 to GOA8 belong to a 2nd group, GOA9 to GOA12 belong to a 3rd group, GOA13 to GOA16 belong to a 4th group, and so on. GOA1 is the foregoing first shift register unit 100, while GOA2, GOA3 and GOA4 are all the foregoing second shift register units 200; and the circuit structure of one group of shift register units is illustrated in FIG. 8. GOA1, as a cascading unit, is cascaded with other groups of shift register units. GOA2, GOA3, and GOA4 are non-cascading units, and thus are not cascaded with other groups of shift register units. GOA2, GOA3, and GOA4 are only connected with the shift register unit within the group, for example, respective second nodes G2 of GOA2, GOA3, and GOA4 are all coupled to the second node G2 of GOA1. Connection modes of other groups of shift register units are also similar.

For example, out1, out2, out3 . . . illustrated in FIG. 7 are 4*M sequentially shifted signals which serve as a first scanning signal and a second scanning signal transmitted to corresponding pixels. CR1, CR5, CR9 . . . illustrated in FIG. 7 are shift signals which serve as cascade signals.

GOA1 is numbered as a 1st shift register unit, GOA2 is numbered as a 2nd shift register unit, GOA3 is numbered as a 3rd shift register unit, GOA4 is numbered as a 4th shift register unit, GOA5 is numbered as a 5th shift register unit, and so on. It should be noted that the 1st shift register unit and the 2nd shift register unit here are numbers of the shift register units; while the first shift register unit and the second shift register unit described above are shift register units for distinguishing different circuit structures. These are two different classification modes that cannot be confused with each other.

For example, a first clock signal terminal CLK1 of a (16Y+1)th shift register unit is connected to a 1st clock line ck1; a third clock signal terminal CLK3 of a (16Y+2)th shift register unit is connected to a 2nd clock line ck2; a third clock signal terminal CLK3 of a (16Y+3)th shift register unit is connected to a 3rd clock line ck3; a third clock signal terminal CLK3 of a (16Y+4)th shift register unit is connected to a 4th clock line ck4; a first clock signal terminal CLK1 of a (16Y+5)th shift register unit is connected to a 5th clock line ck5; a third clock signal terminal CLK3 of a (16Y+6)th shift register unit is connected to a 6th clock line ck6; a third clock signal terminal CLK3 of a (16Y+7)th shift register unit is connected to a 7th clock line ck7; a third clock signal terminal CLK3 of a (16Y+8)th shift register unit is connected to an 8th clock line ck8; a first clock signal terminal CLK1 of a (16Y+9)th shift register unit is connected to a 9th clock line ck9; a third clock signal terminal CLK3 of a (16Y+10)th shift register unit is connected to a 10th clock line ck10; a third clock signal terminal CLK3 of a (16Y+11)th shift register unit is connected to a 11th clock line ck11; a third clock signal terminal CLK3 of a (16Y+12)th shift register unit is connected to a 12th clock line ck12; a first clock signal terminal CLK1 of a (16Y+13)th shift register unit is connected to a 13th clock line ck13; a third clock signal terminal CLK3 of a (16Y+14)th shift register unit is connected to a 14th clock line ck14; a third clock signal terminal CLK3 of a (16Y+15)th shift register unit is connected to a 15th clock line ck15; and a third clock signal terminal CLK3 of a (16Y+16)th shift register unit is connected to a 16th clock line ck16. Y≥0 and Y is an integer.

For example, a second clock signal terminal CLK2 of the (16Y+1)th shift register unit is connected to the 9th clock line ck9; a second clock signal terminal CLK2 of the (16Y+5)th shift register unit is connected to the 13th clock line ck3; a second clock signal terminal CLK2 of the (16Y+9)th shift register unit is connected to the 1st clock line ck1; and a second clock signal terminal CLK2 of the (16Y+13)th shift register unit is connected to the 5th clock line ck5. Connection relationships between the second clock signal terminals CLK2 and the respective clock lines are not illustrated in FIG. 7.

For example, as illustrated in FIG. 7, a first clock signal terminal CLK1 of GOA1 is connected to the 1st clock line ck1; a third clock signal terminal CLK3 of GOA2 is connected to the 2nd clock line ck2; a third clock signal terminal CLK3 of GOA3 is connected to the 3rd clock line ck3; a third clock signal terminal CLK3 of GOA4 is connected to the 4th clock line ck4; a first clock signal terminal CLK1 of GOA5 is connected to the 5th clock line ck5; a third clock signal terminal CLK3 of GOA6 is connected to the 6th clock line ck6; a third clock signal terminal CLK3 of GOA7 is connected to the 7th clock line ck7; a third clock signal terminal CLK3 of GOA8 is connected to the 8th clock line ck8; a first clock signal terminal CLK1 of GOA9 is connected to the 9th clock line ck9; a third clock signal terminal CLK3 of GOA10 is connected to the 10th clock line ck10; a third clock signal terminal CLK3 of GOA11 is connected to the 11th clock line ck11; a third clock signal terminal CLK3 of GOA12 is connected to the 12th clock line ck12; a first clock signal terminal CLK1 of GOA13 is connected to the 13th clock line ck13; a third clock signal terminal CLK3 of GOA14 is connected to the 14th clock line ck14; a third clock signal terminal CLK3 of GOA15 is connected to the 15th clock line ck15; and a third clock signal terminal CLK3 of GOA16 is connected to the 16th clock line ck16, and so on.

For example, a second clock signal terminal CLK2 of GOA1 is connected to the 9th clock line ck9; a second clock signal terminal CLK2 of GOA5 is connected to the 13th clock line ck13; a second clock signal terminal CLK2 of GOA9 is connected to the 1st clock line ck1; and a second clock signal terminal CLK2 of GOA13 is connected to the 5th clock line ck5, and so on.

For example, a first input signal and a second input signal received by a Kth group of shift register units are the shift signal output by the first shift register unit in a (K−2)th group of shift register units, where 3≤K≤M and K is an integer. A 1st group of shift register units receives a first starting signal STV1 to serve as the first input signal and the second input signal of the 1st group of shift register units, while a 2nd group of shift register units receives a second starting signal STV2 to serve as the first input signal and the second input signal of the 2nd group of shift register units. The first starting signal STV1 is different from the second starting signal STV2. For example, the first starting signal STV1 and the second starting signal STV2 may be signals supplied by circuits other than the gate driving circuit 10, or may also be signals supplied by circuits inside the gate driving circuit 10, which is not limited in the embodiments of the present disclosure. For example, in the case where the first starting signal STV1 and the second starting signal STV2 are signals supplied by the circuits inside the gate driving circuit 10, the first starting signal STV1 and the second starting signal STV2 may be respectively supplied by a first preposed shift register unit and a second preposed shift register unit inside the gate driving circuit 10. Detailed introduction to the first preposed shift register unit and the second preposed shift register unit will be illustrated later, and no details will be repeated here.

For example, a first reset signal and a second reset signal received by a Qth group of shift register units are the shift signal output by the first shift register unit in a (Q+3)th group of shift register units, where 1≤Q≤M−3 and Q is an integer. An (M−2)th group of shift register units receives a first initialization signal to serve as a first reset signal and a second reset signal of the (M−2)th group of shift register units; an (M−1)th group of shift register units receives a second initialization signal to serve as a first reset signal and a second reset signal of the (M−1)th group of shift register units; and an Mth group of shift register units receives a third initialization signal to serve as a first reset signal and a second reset signal of the Mth group of shift register units. The first initialization signal, the second initialization signal, and the third initialization signal are different from each other.

For example, as illustrated in FIG. 7, a first input signal and a second input signal received by the 3rd group of shift register units (GOA9 to GOA12) are the shift signal CR1 output by the first shift register unit (i.e., GOA1) in the 1st group of shift register units, the first input signal and the second input signal are a same signal and both are the shift signal CR1; a first input signal and a second input signal received by the 4th group of shift register units (GOA13 to GOA16) are the shift signal CR5 output by the first shift register unit (i.e., GOA5) in the 2nd group of shift register units; the first input signal and the second input signal are a same signal and both are the shift signal CR5, and so on. The 1st group of shift register units (GOA1 to GOA4) receives the first starting signal STV1 to serve as the first input signal and the second input signal, the first input signal and the second input signal are a same signal and both are the first starting signal STV1; the 2nd group of shift register units (GOA5 to GOA8) receives the second starting signal STV2 to serve as the first input signal and the second input signal, the first input signal and the second input signal are a same signal and both are the second starting signal STV2.

For example, as illustrated in FIG. 7, the first reset signal and the second reset signal received by the 1st group of shift register units (GOA1 to GOA4) are the shift signal CR13 output by the first shift register unit (i.e., GOA13) in the 4th group of shift register units, the first reset signal and the second reset signal are a same signal and both are the shift signal CR13; the first reset signal and the second reset signal received by the 2nd group of shift register units (GOA5 to GOA8) are the shift signal CR17 output by the first shift register unit (i.e., GOA17) in the 5th group of shift register units, the first reset signal and the second reset signal are a same signal and both are the shift signal CR17, and so on. With respect to last few groups of shift register units (not illustrated in FIG. 7) in the M groups, a first initialization signal, a second initialization signal, and a third initialization signal are supplied to serve as the first reset signal and the second reset signal required.

Figure 9:
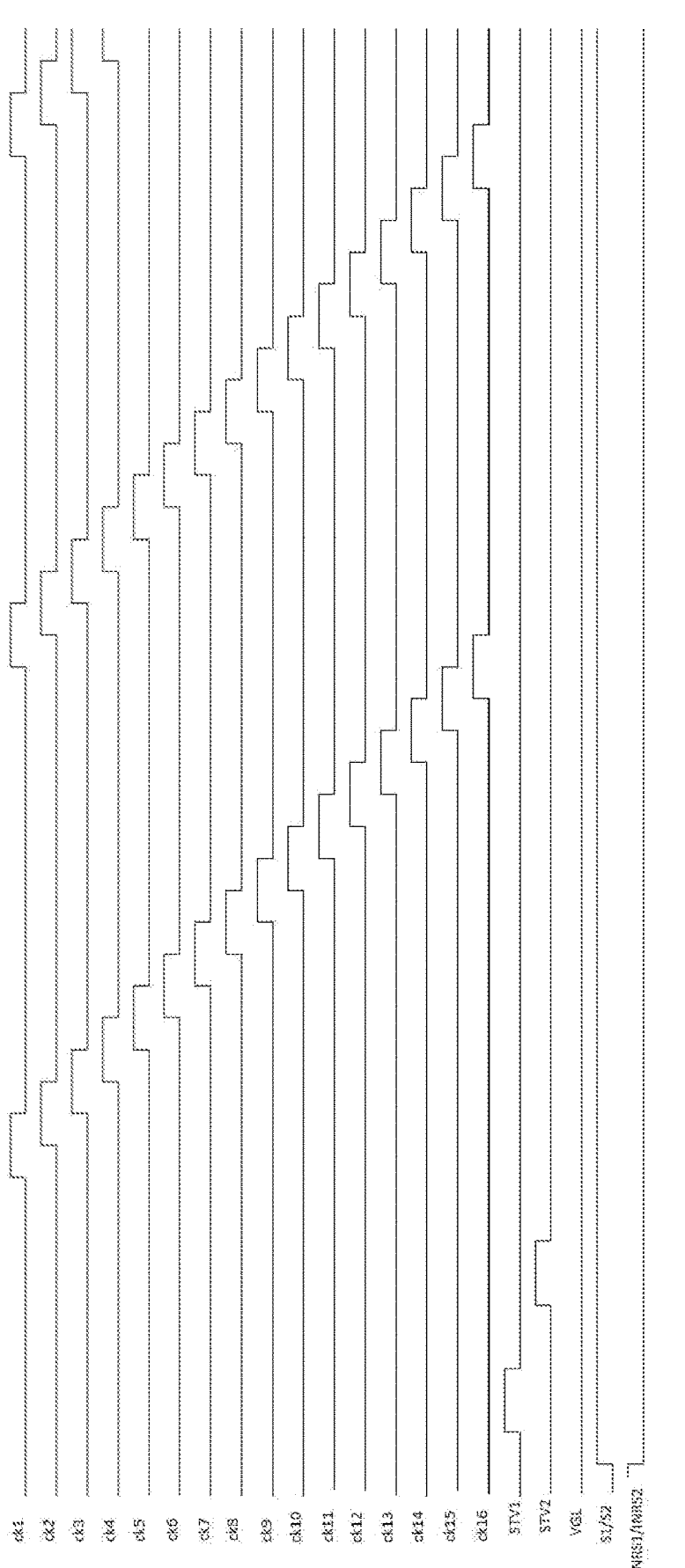
FIG. 9 is a timing diagram I of the gate driving circuit provided by some embodiments of the present disclosure.
Figure 10:
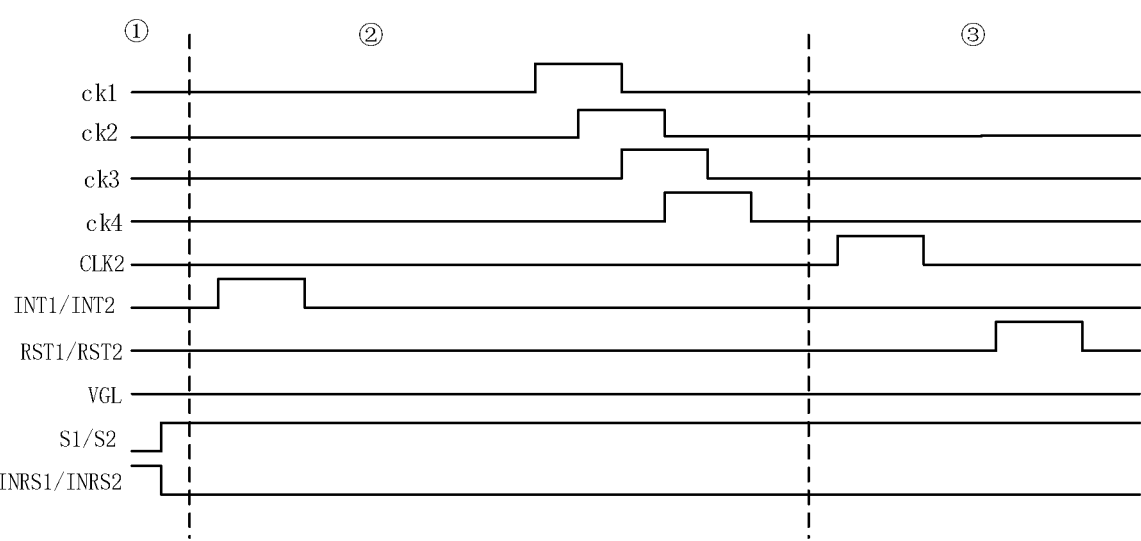
FIG. 10 is a timing diagram II of the gate driving circuit provided by some embodiments of the present disclosure.
Figure 11:
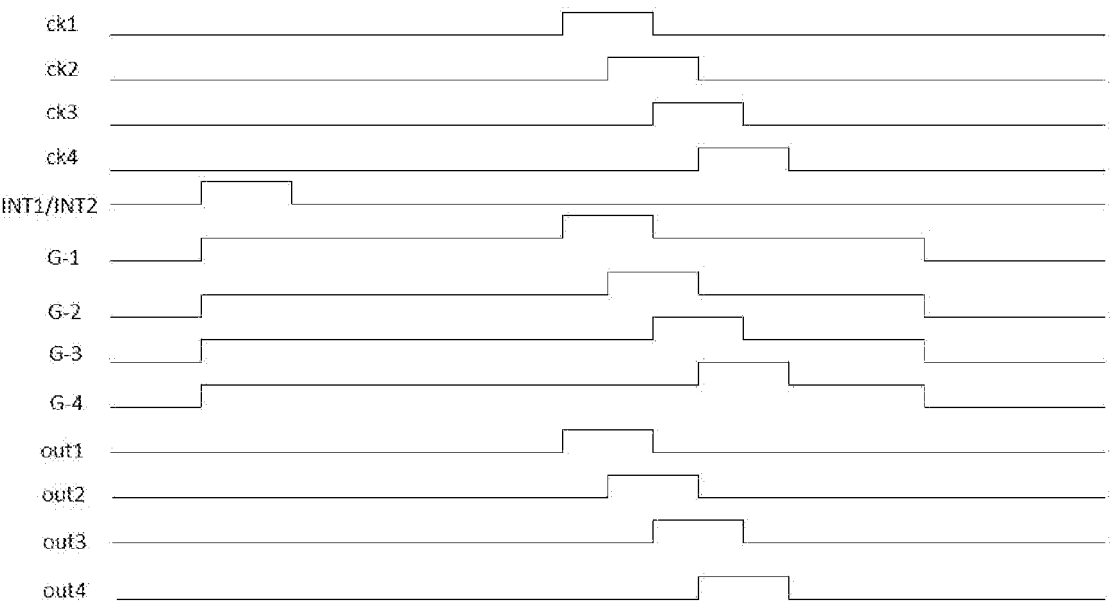
FIG. 11 is a timing diagram III of the gate driving circuit provided by some embodiments of the present disclosure.

FIG. 9 is a timing diagram I of the gate driving circuit provided by some embodiments of the present disclosure, FIG. 10 is a timing diagram II of the gate driving circuit provided by some embodiments of the present disclosure, and FIG. 11 is a timing diagram III of the gate driving circuit provided by some embodiments of the present disclosure. FIG. 10 is a schematic diagram of partial timing in FIG. 9. FIG. 11 is a schematic diagram of partial timing in FIG. 9, as well as node potentials, and scanning signals, where, G-1 represents the first node G1 of GOA1, G-2 represents the third node G3 of GOA2, G-3 represents the third node G3 of GOA3, G-4 represents the third node G3 of GOA4, and so on. The timing of FIG. 9 to FIG. 11 is used, for example, in the gate driving circuit 10 illustrated in FIG. 7. It should be noted that respective reference signs in the timing diagram are not only used to represent a corresponding signal terminal or node, but also used to represent a level of the corresponding signal or node; respective embodiments below are the same, and no details will be repeated. The first voltage terminal VGL1, the second voltage terminal VGL2, the third voltage terminal VGL3, and the fourth voltage terminal VGL4 are described above, and voltages supplied by these voltage terminals may be the same, so they are all represented by VGL in the timing diagrams, but this does not constitute a limitation on the embodiments of the present disclosure.

As illustrated in FIG. 10, reset operation is performed during phase ①, the first initial reset signal INRS1 and the second initial reset signal INRS2 initialize potentials of the first node G1 and the third node G3 in the respective GOA to low potentials. Next, in phase ②, outputs are carried out; when the first input signal INT1 or the second input signal INT2 is input, the first node G1 or the third node G3 is at a high potential, the sixth transistor T6 and the seventh transistor T7 corresponding thereto are turned on, and the fifteenth transistor T15 corresponding thereto is turned on, so, out1 to out4 which are respectively high potentials are correspondingly output when ck1 to ck4 are respectively at high potentials. In stage ③, reset is carried out; the second clock signal CLK2 is at a high potential, and the fourth transistor T4 is turned on, so that the second node G2 is at a high potential. Therefore, the eighth transistor T8 is turned on, so that the first node G1 is at a low potential, thereby turning off the output; the sixteenth transistor T16 is turned on, so that the third node G3 is at a low potential, thereby turning off the output.

Figure 12:
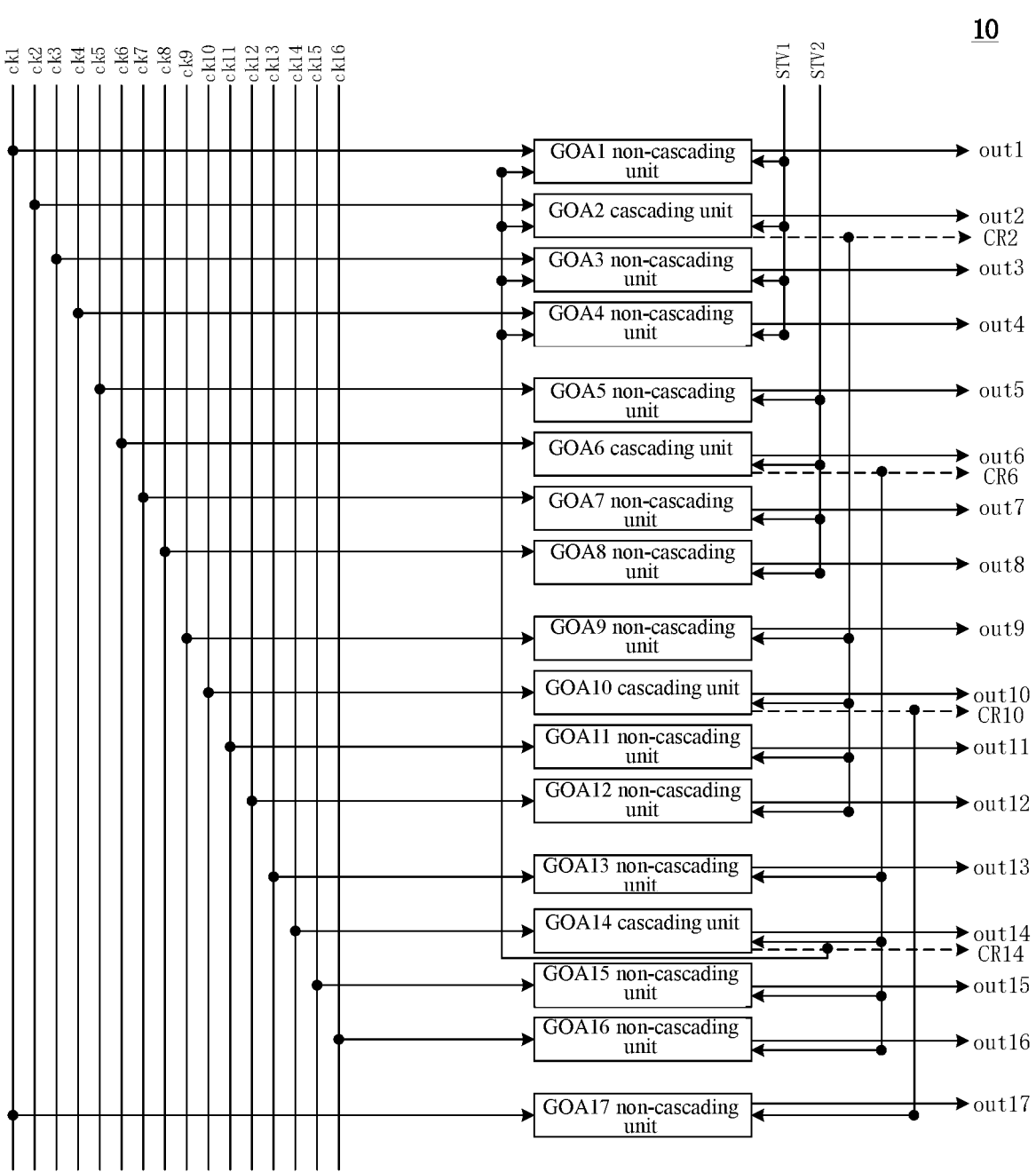
FIG. 12 is a schematic diagram of a cascade relationship of the gate driving circuit provided by some embodiments of the present disclosure.

FIG. 12 is a schematic diagram of a cascade relationship of the gate driving circuit provided by some embodiments of the present disclosure. As illustrated in FIG. 12, in this embodiment, N=4, that is, the amount of shift register units in each group is 4, where, 1 shift register unit is the first shift register unit and 3 shift register units are the second shift register units. In the gate driving circuit 10, every 4 rows of shift register units share one second node G2. The gate driving circuit 10 is connected to 16 clock lines, and the 16 clock lines include a 1st clock line ck1 to a 16th clock line ck16.

For example, each group of shift register units is numbered in an order of a first one second shift register unit, the first shift register unit, a second one second shift register unit, and a third one second shift register unit. The M groups of shift register units are numbered sequentially, so that 4*M shift register units contained in the gate driving circuit 10 are sequentially numbered as a 1st shift register unit to a (4*M)th shift register unit. For example, a (4D+2)th shift register unit is the foregoing first shift register unit 100, a (4D+1)th shift register unit, a (4D+3)th shift register unit, and a (4D+4)th shift register unit are the foregoing second shift register units 200, where D≥0 and D is an integer.

The gate driving circuit 10 illustrated in FIG. 12 differs from the gate driving circuit 10 illustrated in FIG. 7 in that: in each group of shift register units, the first shift register unit 100 used for cascading is located in a 2nd position within the group, while non-cascading second shift register units 200 are located in a 1st position, a 3rd position, and a 4th position within the group.

For example, as illustrated in FIG. 12, GOA1 to GOA4 belong to a 1st group, GOA5 to GOA8 belong to a 2nd group, GOA9 to GOA12 belong to a 3rd group, GOA13 to GOA16 belong to a 4th group, and so on. GOA2 is the foregoing first shift register unit 100, while GOA1, GOA3 and GOA4 are all the foregoing second shift register units 200. GOA2, serving as a cascading unit, is cascaded with other groups of shift register units. GOA1, GOA3, and GOA4 serve as non-cascading units, and thus are not cascaded with other groups of shift register units. GOA1, GOA3, and GOA4 are only connected with the shift register unit within the group, for example, respective second nodes G2 of GOA1, GOA3, and GOA4 are all coupled to the second node G2 of GOA2. Connection modes of other groups of shift register units are also similar.

For example, out1, out2, out3 . . . illustrated in FIG. 12 are 4*M sequentially shifted signals serving as a first scanning signal and a second scanning signal transmitted to corresponding pixels. CR2, CR6, CR10 . . . illustrated in FIG. 12 are shift signals serving as cascade signals.

GOA1 is numbered as a 1st shift register unit, GOA2 is numbered as a 2nd shift register unit, GOA3 is numbered as a 3rd shift register unit, GOA4 is numbered as a 4th shift register unit, GOA5 is numbered as a 5th shift register unit, and so on. It should be noted that the 1st shift register unit and the 2nd shift register unit here are numbers of the shift register units; while the first shift register unit and the second shift register unit described above are shift register units for distinguishing different circuit structures. These are two different classification modes that cannot be confused with each other.

For example, a third clock signal terminal CLK3 of a (16J+1)th shift register unit is connected to a 1st clock line ck1; a first clock signal terminal CLK1 of a (16J+2)th shift register unit is connected to a 2nd clock line ck2; a third clock signal terminal CLK3 of a (16J+3)th shift register unit is connected to a 3rd clock line ck3; a third clock signal terminal CLK3 of a (16J+4)th shift register unit is connected to a 4th clock line ck4; a third clock signal terminal CLK3 of a (16J+5)th shift register unit is connected to a 5th clock line ck5; a first clock signal terminal CLK1 of a (16J+6)th shift register unit is connected to a 6th clock line ck6; a third clock signal terminal CLK3 of a (16J+7)th shift register unit is connected to a 7th clock line ck7; a third clock signal terminal CLK3 of a (16J+8)th shift register unit is connected to an 8th clock line ck8; a third clock signal terminal CLK3 of a (16J+9)th shift register unit is connected to a 9th clock line ck9; a first clock signal terminal CLK1 of a (16J+10)th shift register unit is connected to a 10th clock line ck10; a third clock signal terminal CLK3 of a (16J+11)th shift register unit is connected to an 11th clock line ck11; a third clock signal terminal CLK3 of a (16J+12)th shift register unit is connected to a 12th clock line ck12; a third clock signal terminal CLK3 of a (16J+13)th shift register unit is connected to a 13th clock line ck13; a first clock signal terminal CLK1 of a (16J+14)th shift register unit is connected to a 14th clock line ck14; a third clock signal terminal CLK3 of a (16J+15)th shift register unit is connected to a 15th clock line ck15; and a third clock signal terminal CLK3 of a (16J+16)th shift register unit is connected to a 16th clock line ck16. J≥0 and J is an integer.

For example, a second clock signal terminal CLK2 of the (16J+2)th shift register unit is connected to the 10th clock line ck10; a second clock signal terminal CLK2 of the (16J+6)th shift register unit is connected to the 14th clock line ck14; a second clock signal terminal CLK2 of the (16J+10)th shift register unit is connected to the 2nd clock line ck2; and a second clock signal terminal CLK2 of the (16J+14)th shift register unit is connected to the 6th clock line ck6. Connection relationships between the second clock signal terminals CLK2 and the respective clock lines are not illustrated in FIG. 12.

For example, as illustrated in FIG. 12, GOA1 to GOA16 are sequentially coupled to the 1st clock line ck1 to the 16th clock line ck16, and so on. The second clock signal terminal CLK2 of GOA2 is connected to the 10th clock line ck10, the second clock signal terminal CLK2 of GOA6 is connected to the 14th clock line ck14, the second clock signal terminal CLK2 of GOA10 is connected to the 2nd clock line ck2, and the second clock signal terminal CLK2 of GOA14 is connected to the 6th clock line ck6.

A first input signal and a second input signal received by the 3rd group of shift register units (GOA9 to GOA12) are the shift signal CR2 output by the first shift register unit (i.e., GOA2) in the 1st group of shift register units, the first input signal and the second input signal are a same signal and both are the shift signal CR2; a first input signal and a second input signal received by the 4th group of shift register units (GOA13 to GOA16) are the shift signal CR6 output by the first shift register unit (i.e., GOA6) in the 2nd group of shift register units, the first input signal and the second input signal are a same signal and both are the shift signal CR6, and so on. The 1st group of shift register units (GOA1 to GOA4) receives a first starting signal STV1 to serve as the first input signal and the second input signal, the first input signal and the second input signal are a same signal and both are the first starting signal STV1; the 2nd group of shift register units (GOA5 to GOA8) receives a second starting signal STV2 to serve as the first input signal and the second input signal, the first input signal and the second input signal are a same signal and both are the second starting signal STV2.

A first reset signal and a second reset signal received by the 1st group of shift register units (GOA1 to GOA4) are the shift signal CR14 output by the first shift register unit (i.e., GOA14) in the 4th group of shift register units, the first reset signal and the second reset signal are a same signal and both are the shift signal CR14; a first reset signal and a second reset signal received by the 2nd group of shift register units (GOA5 to GOA8) are the shift signal CR18 output by the first shift register unit (i.e., GOA18) in the 5th group of shift register units, the first reset signal and the second reset signal are a same signal and both are the shift signal CR18 (GOA18 and CR18 are not illustrated in FIG. 12), and so on. With respect to last few groups of shift register units (not illustrated in FIG. 12) in the M groups, a first initialization signal, a second initialization signal, and a third initialization signal are supplied as the first reset signal and the second reset signal required.

Figure 13:
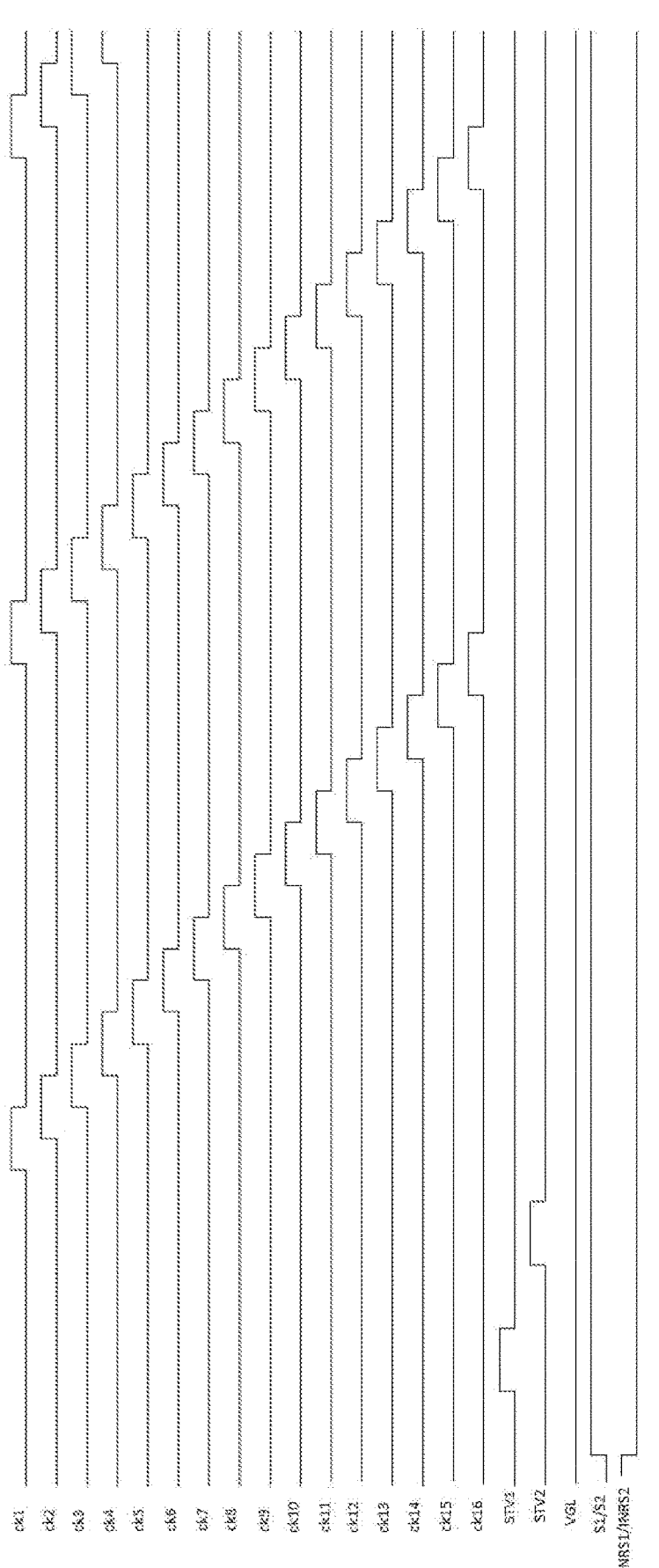
FIG. 13 is a timing diagram of the gate driving circuit provided by some embodiments of the present disclosure.

FIG. 13 is a timing diagram of the gate driving circuit provided by some embodiments of the present disclosure. Timing illustrated in FIG. 13 is used, for example, in the gate driving circuit 10 illustrated in FIG. 12. An operation principle of this gate driving circuit 10 is basically similar to the operation principle of the gate driving circuit 10 illustrated in FIG. 7. The contents above may be referred to for relevant illustration, and no details will be repeated here.

For example, in some examples, as illustrated in FIG. 9 and FIG. 13, the 1st clock line ck1 to the 16th clock line ck16 output 16 different clock signals; and the 16 clock signals are sequentially shifted in terms of timing. Resolution in this case is standard resolution.

For example, in other examples, among these 16 clock lines, clock signals output from a (4L+1)th clock line to a (4L+4)th clock line are the same, where L≥0 and L is an integer. The 1st clock line ck1 to the 16th clock line ck16 output 4 different clock signals; and the 4 clock signals are sequentially shifted in terms of timing. That is, every 4 adjacent clock lines output a same clock signal, for example, the 1st clock line ck1 to the 4th clock line ck4 output a same clock signal, the 5th clock line ck5 to the 8th clock line ck8 output a same clock signal, the 9th clock line ck9 to the 12th clock line ck12 output a same clock signal, the 13th clock line ck13 to the 16th clock line ck16 output a same clock signal, and so on. Thus, waveforms of adjacent scanning signals in every 4 rows may be made the same, so that adjacent pixels in every 4 rows are simultaneously refreshed (simultaneously displayed), so as to convert resolution to ¼ of the standard resolution. Therefore, screen display resolution can be programmable, and partition display can be implemented.

For example, in some other examples, among these 16 clock lines, clock signals output from a (2H+1)th clock line to a (2H+2)th clock line are the same, where H≥0 and H is an integer. The 1st clock line ck1 to the 16th clock line ck16 output 8 different clock signals; and the 8 clock signals are sequentially shifted in terms of timing. That is, every 2 adjacent clock lines output a same clock signal. For example, the 1st clock line ck1 and the 2nd clock line ck2 output a same clock signal, the 3rd clock line ck3 and the 4th clock line ck4 output a same clock signal, the 5th clock line ck5 and the 6th clock line ck6 output a same clock signal, and so on. Thus, waveforms of adjacent scanning signals in every 2 rows can be made the same, so that adjacent pixels in every 2 rows are simultaneously refreshed (simultaneously displayed), so as to convert resolution to ½ of the standard resolution. Therefore, screen display resolution can be programmable, and partition display can be implemented.

In the above-described ways, changes to ¼ and ½ of the resolution can be implemented by only changing timing of the clock signals supplied by the clock lines ck1 to ck16, and partition display can be implemented, without changing the circuit structure, which is easy to operate and is easy to implement.

Figure 14:
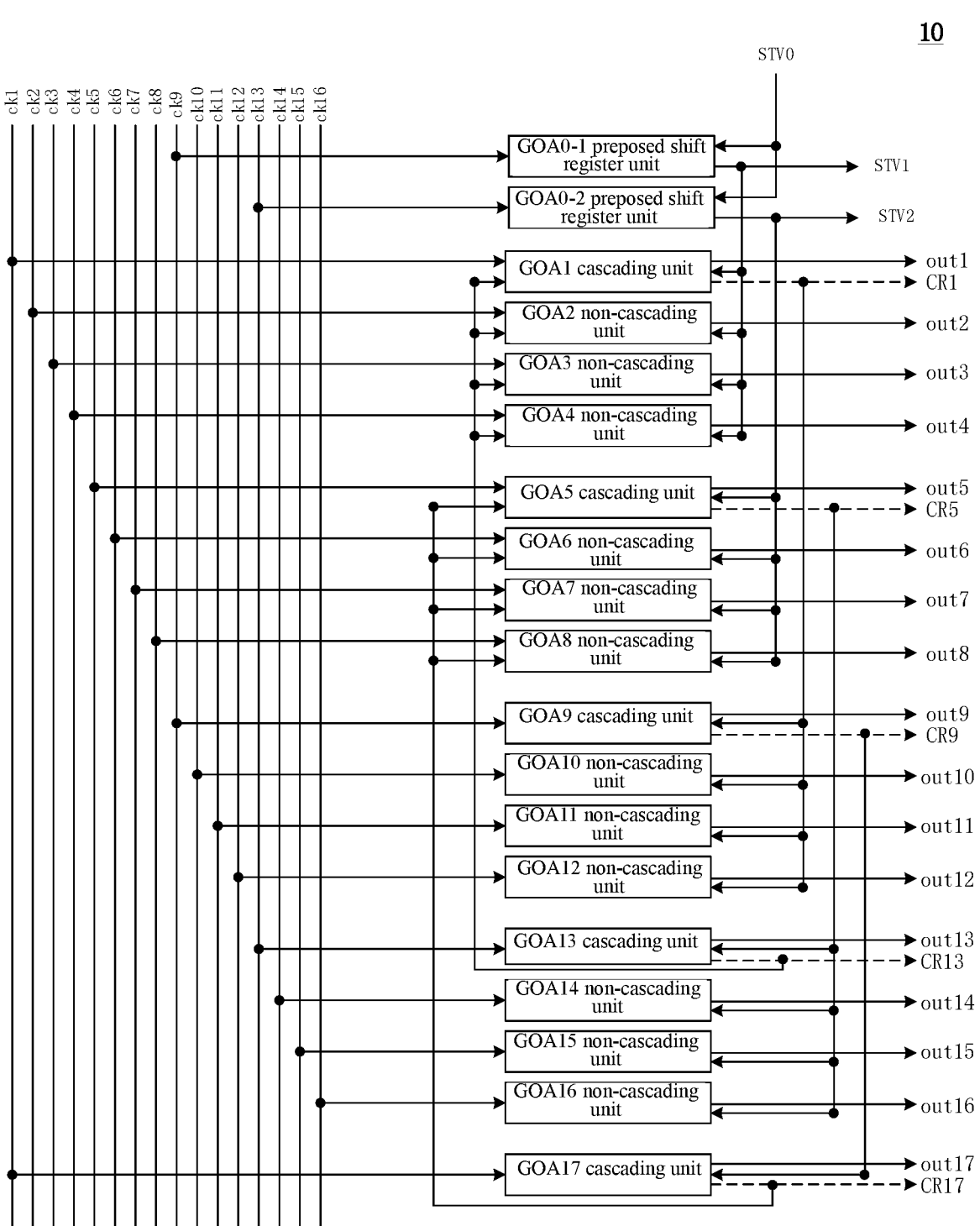
FIG. 14 is a schematic diagram of a cascade relationship of the gate driving circuit provided by some embodiments of the present disclosure.

FIG. 14 is a schematic diagram of a cascade relationship of the gate driving circuit provided by some embodiments of the present disclosure. In the example, the gate driving circuit 10 further includes a first preposed shift register unit (e.g., GOA0-1) and a second preposed shift register unit (e.g., GOA0-2), so as to supply the first starting signal STV1 and the second starting signal STV2. Other structures of the gate driving circuit 10 are basically similar to the gate driving circuit 10 illustrated in FIG. 7. The contents above may be referred to for relevant illustration, and no details will be repeated here.

For example, the first preposed shift register unit is configured to receive a trigger signal to output the first starting signal STV1; the second preposed shift register unit is configured to receive a trigger signal to output the second starting signal STV2. For example, neither the first preposed shift register unit nor the second preposed shift register unit supplies a scanning signal to the pixels on the display panel; and neither the first preposed shift register unit nor the second preposed shift register unit is connected to signal lines coupled to respective rows of pixels.

For example, as illustrated in FIG. 14, in the gate driving circuit 10, in addition to providing the M groups of shift register unit, there are further provided a first preposed shift register unit and a second preposed shift register unit. For example, GOA0-1 is the first preposed shift register unit; GOA0-1, serving as a pre-unit (or referred to as a dummy unit), receives a trigger signal STV0 to output the first starting signal STV1; the first starting signal STV1 is input to GOA1 to GOA4 to serve as a first input signal and a second input signal. GOA0-2 is the second preposed shift register unit; GOA0-2, serving as a pre-unit (or a dummy unit), receives the trigger signal STV0 to output the second starting signal STV2; the second starting signal STV2 is input to GOA5 to GOA8 to serve as a first input signal and a second input signal. For example, the trigger signal STV0 is a signal supplied by a circuit other than the gate driving circuit 10; and the first preposed shift register unit and the second preposed shift register unit receive a same trigger signal STV0. For example, the first preposed shift register unit (GOA0-1) is also connected with the 9th clock line ck9, and the second preposed shift register unit (GOA0-2) is also connected with the 13th clock line ck13.

For example, both the first preposed shift register unit (GOA0-1) and the second preposed shift register unit (GOA0-2) may adopt a circuit structure the same as that of the first shift register unit 100, that is, may adopt the circuit structure illustrated in FIG. 5. Of course, the embodiments of the present disclosure are not limited thereto; the first preposed shift register unit (GOA0-1) and the second preposed shift register unit (GOA0-2) may also adopt a more simplified circuit structure, as long as they can respectively output the first starting signal STV1 and the second starting signal STV2 in response to the trigger signal STV0, which may be determined according to actual needs, and will not be limited in the embodiments of the present disclosure.

Figure 15A:
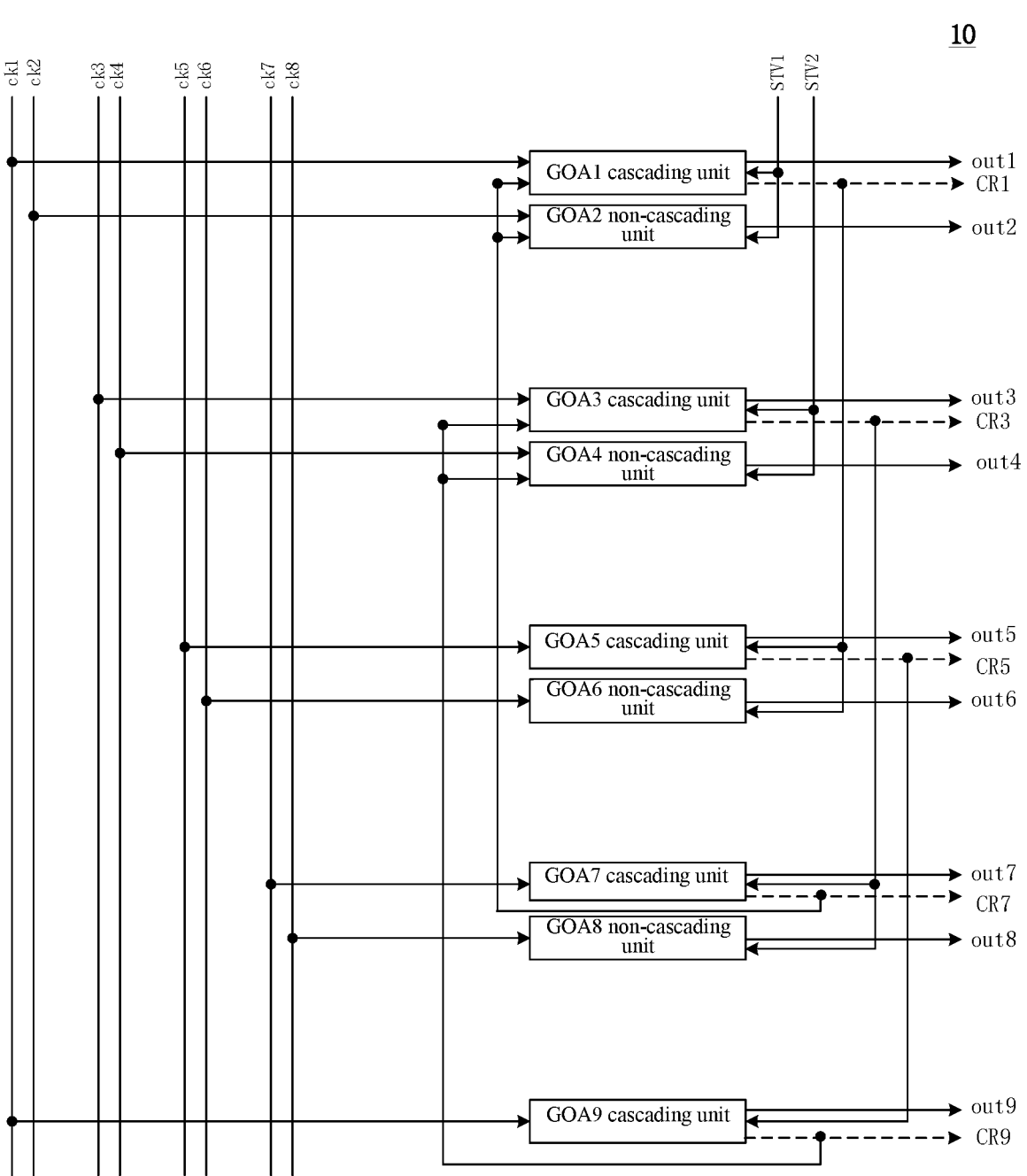
FIG. 15A is a schematic diagram of a cascade relationship of another gate driving circuit provided by some embodiments of the present disclosure.

FIG. 15A is a schematic diagram of a cascade relationship of another gate driving circuit provided by some embodiments of the present disclosure. As illustrated in FIG. 15A, in this embodiment, N=2, that is, the amount of shift register units in each group is 2, where, 1 shift register unit is the first shift register unit, and the other shift register unit is the second shift register unit. In the gate driving circuit 10, every 2 rows of shift register units share one second node G2. The gate driving circuit 10 is connected to 8 clock lines; and the 8 clock lines include a 1st clock line ck1 to an 8th clock line ck8.

Each group of shift register units is numbered in an order of the first shift register unit and the second shift register unit. the M groups of shift register units are numbered sequentially, so that 2*M shift register units contained in the gate driving circuit 10 are sequentially numbered as a 1st shift register unit to a (2*M)th shift register unit. For example, a (2G+1)th shift register unit is the foregoing first shift register unit 100, and a (2G+2)th shift register unit is the foregoing second shift register units 200, where G≥0 and G is an integer.

The gate driving circuit 10 illustrated in FIG. 15A differs from the gate driving circuit 10 illustrated in FIG. 7 in that: the amount of shift register units in each group is changed from 4 to 2. The gate driving circuit 10 illustrated in FIG. 15A and the gate driving circuit 10 illustrated in FIG. 7 are the same in that: the first shift register unit 100 used for cascading is still located in a 1st position within the group, and the non-cascading second shift register units 200 are located in other subsequent positions within the group.

Figure 15B:
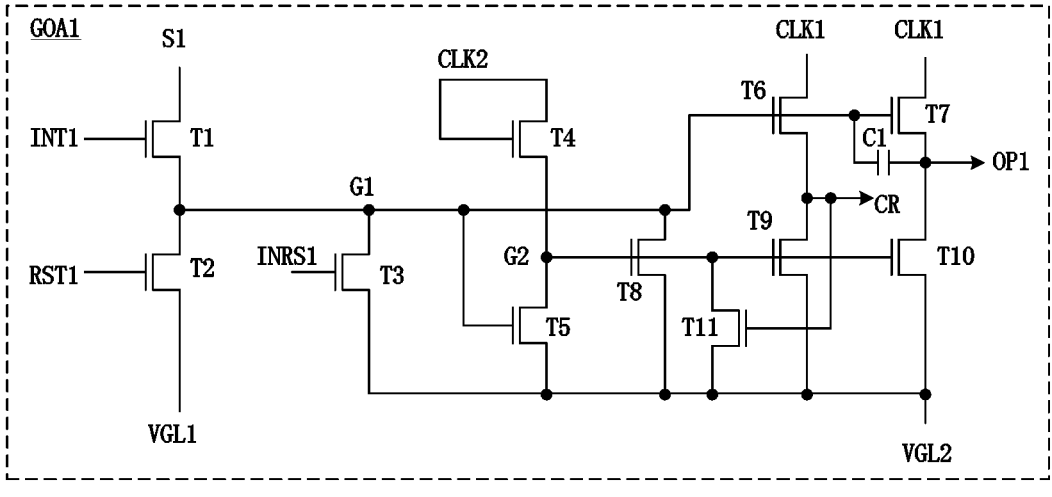
FIG. 15B is a schematic diagram of a circuit structure of one group of shift register units in the gate driving circuit illustrated in FIG. 15A.
Figure 15B:
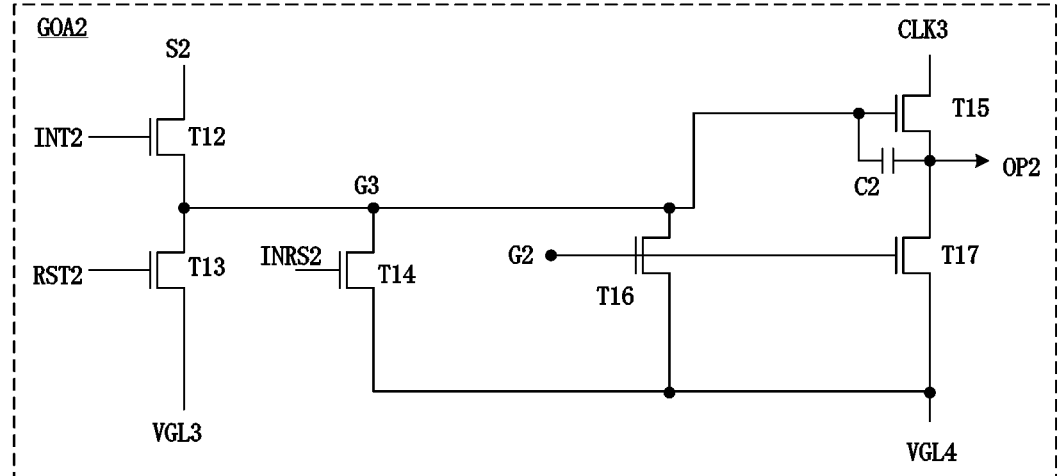

For example, as illustrated in FIG. 15A, GOA1 and GOA2 belong to a 1st group, GOA3 and GOA4 belong to a 2nd group, GOA5 and GOA6 belong to a 3rd group, GOA7 and GOA8 belong to a 4th group, and so on. The circuit structure of one group of shift register units is illustrated in FIG. 15B. GOA1 is the foregoing first shift register unit 100, while GOA2 is the foregoing second shift register unit 200. GOA1, serving as a cascading unit, is cascaded with other groups of shift register units. GOA2 serves as a non-cascading unit, and thus is not cascaded with other groups of shift register units. GOA2 is only connected with the shift register unit within the group, for example, a second node G2 of GOA2 is coupled to a second node G2 of GOA1. Connection modes of other groups of shift register units are also similar.

For example, out1, out2, out3 . . . illustrated in FIG. 15A are 2*M sequentially shifted signals serving as a first scanning signal and a second scanning signal transmitted to corresponding pixels. CR1, CR3, CR5 . . . illustrated in 15A are shift signals serving as cascade signals.

GOA1 is numbered as a 1st shift register unit, GOA2 is numbered as a 2nd shift register unit, GOA3 is numbered as a 3rd shift register unit, GOA4 is numbered as a 4th shift register unit, GOA5 is numbered as a 5th shift register unit, and so on. It should be noted that the 1st shift register unit and the 2nd shift register unit here are numbers of the shift register units; while the first shift register unit and the second shift register unit described above are shift register units for distinguishing different circuit structures. These are two different classification modes that cannot be confused with each other.

For example, a first clock signal terminal CLK1 of a (8Z+1)th shift register unit is connected to a 1st clock line ck1; a third clock signal terminal CLK3 of a (8Z+2)th shift register unit is connected to a 2nd clock line ck2; a first clock signal terminal CLK1 of a (8Z+3)th shift register unit is connected to a 3rd clock line ck3; a third clock signal terminal CLK3 of a (8Z+4)th shift register unit is connected to a 4th clock line ck4; a first clock signal terminal CLK1 of a (8Z+5)th shift register unit is connected to a 5th clock line ck5; a third clock signal terminal CLK3 of a (8Z+6)th shift register unit is connected to a 6th clock line ck6; a first clock signal terminal CLK1 of a (8Z+7)th shift register unit is connected to a 7th clock line ck7; and a third clock signal terminal CLK3 of a (8Z+8)th shift register unit is connected to an 8th clock line ck8. Z≥0 and Z is an integer.

For example, a second clock signal terminal CLK2 of the (8Z+1)th shift register unit is connected to the 5th clock line ck5; a second clock signal terminal CLK2 of the (8Z+3)th shift register unit is connected to the 7th clock line ck7; a second clock signal terminal CLK2 of the (8Z+5)th shift register unit is connected to the 1st clock line ck1; and a second clock signal terminal CLK2 of the (8Z+7)th shift register unit is connected to the 3rd clock line ck3. Connection relationships between the second clock signal terminals CLK2 and the respective clock lines are not illustrated in FIG. 15A.

For example, as illustrated in FIG. 15A, GOA1 to GOA8 are sequentially coupled to the 1st clock line ck1 to the 8th clock line ck8, and so on. The second clock signal terminal CLK2 of GOA1 is connected to the 5th clock line ck5; the second clock signal terminal CLK2 of GOA3 is connected to the 7th clock line ck7; the second clock signal terminal CLK2 of GOA5 is connected to the 1st clock line ck1; and the second clock signal terminal CLK2 of GOA7 is connected to the 3rd clock line ck3.

A first input signal and a second input signal received by the 3rd group of shift register units (GOA5 to GOA6) are the shift signal CR1 output by the first shift register unit (i.e., GOA1) in the 1st group of shift register units, the first input signal and the second input signal are a same signal and both are the shift signal CR1; a first input signal and a second input signal received by the 4th group of shift register units (GOA7 to GOA8) are the shift signal CR3 output by the first shift register unit (i.e., GOA3) in the 2nd group of shift register units, the first input signal and the second input signal are a same signal and both are the shift signal CR3, and so on. The 1st group of shift register units (GOA1 and GOA2) receives the first starting signal STV1 to serve as a first input signal and a second input signal, the first input signal and the second input signal are a same signal and both are the first starting signal STV1; the 2nd group of shift register units (GOA3 and GOA4) receives the second starting signal STV2 to serve as a first input signal and a second input signal, the first input signal and the second input signal are a same signal and both are the second starting signal STV2.

A first reset signal and a second reset signal received by the 1st group of shift register units (GOA1 and GOA2) are the shift signal CR7 output by the first shift register unit (i.e., GOA7) in the 4th group of shift register units, the first reset signal and the second reset signal are a same signal and both are the shift signal CR7; a first reset signal and a second reset signal received by the 2nd group of shift register units (GOA3 and GOA4) are the shift signal CR9 output by the first shift register unit (i.e., GOA9) in the 5th group of shift register units, the first reset signal and the second reset signal are a same signal and both are the shift signal CR9, and so on. With respect to last few groups of shift register units (not illustrated in FIG. 15A) in the M groups, a first initialization signal, a second initialization signal, and a third initialization signal are supplied as the first reset signal and the second reset signal required.

Figures 16, 17:
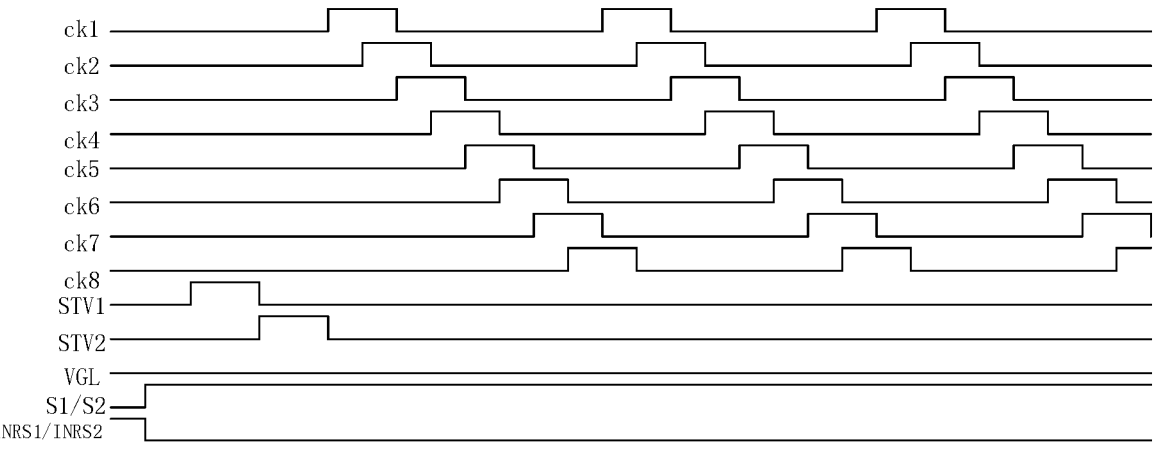
FIG. 16 is a timing diagram of the gate driving circuit provided by some embodiments of the present disclosure.
FIG. 17 is a schematic block diagram of a display panel provided by some embodiments of the present disclosure.

FIG. 16 is a timing diagram of the gate driving circuit provided by some embodiments of the present disclosure. Timing illustrated in FIG. 16 is used, for example, in the gate driving circuit 10 illustrated in FIG. 15A. An operation principle of the gate driving circuit 10 is basically similar to the operation principle of the gate driving circuit 10 illustrated in FIG. 7. The contents above may be referred to for relevant illustration, and no details will be repeated here.

For example, in some examples, as illustrated in FIG. 16, the 1st clock line ck1 to the 8th clock line ck8 output 8 different clock signals; and the 8 clock signals are sequentially shifted in terms of timing. Resolution in this case is standard resolution.

For example, in other examples, among these 8 clock lines, clock signals output from a (2R+1)th clock line to a (2R+2)th clock line are the same, where R≥0 and R is an integer. The 1st clock line ck1 to the 8th clock line ck8 output 4 different clock signals; and the 4 clock signals are sequentially shifted in terms of timing. That is, every 2 adjacent clock lines output a same clock signal, for example, the 1st clock line ck1 and the 2nd clock line ck2 output a same clock signal, the 3rd clock line ck3 and the 4th clock line ck4 output a same clock signal, the 5th clock line ck5 and the 6th clock line ck6 output a same clock signal, the 7th clock line ck7 and the 8th clock line ck8 output a same clock signal, and so on. Thus, waveforms of adjacent scanning signals in every 2 rows can be made the same, so that adjacent pixels in every 2 rows are simultaneously refreshed (simultaneously displayed) to convert resolution to ½ of the standard resolution. Therefore, screen display resolution can be programmable, and partition display can be implemented. In the above-described modes, changes to ½ of the resolution can be implemented by only changing timing of the clock signals supplied by the clock lines ck1 to ck8, partition display can be implemented, without changing the circuit structure, which is easy to operate and is easy to implement.

It should be noted that in the respective embodiments of the present disclosure, cascading modes of the respective stages of shift register units in the gate driving circuit and modes of connection with the clock lines are not limited, and may be the cascading modes as described in the above-described examples, or may also be other applicable cascading modes, which may be determined according to actual needs, and will not be limited in the embodiments of the present disclosure.

For example, when the gate driving circuit is adopted to drive a display panel, the gate driving circuit may be arranged on one side of the display panel. For example, the display panel includes a plurality of rows of gate lines, and first scanning signal output terminals OP1 and second scanning signal output terminals OP2 of the respective stages of shift register units in the gate driving circuit may be sequentially connected with the plurality of rows of gate lines, for outputting a first scanning signal and a second scanning signal (only one scanning signal is output per row, the first scanning signal is output in the case where the shift register unit is the first shift register unit, and the second scanning signal is output in the case where the shift register unit is the second shift register unit). Of course, the gate driving circuit may also be respectively arranged on both sides of the display panel to implement bilateral drive; and the arrangement mode of the gate driving circuit is not limited in the embodiments of the present disclosure. For example, one gate driving circuit may be arranged on one side of the display panel to drive odd rows of gate lines, and another gate driving circuit may be arranged on the other side of the display panel to drive even rows of gate lines.

In the gate driving circuit provided by the embodiments of the present disclosure, by making a plurality of shift register units sharing a same second node G2, a control circuit for controlling a level of the second node G2 may be provided only in a first shift register unit in each group of shift register units, without providing a corresponding control circuit in a second shift register unit, thereby simplifying the circuit structure of the second shift register unit. The gate driving circuit can reduce the amount of transistors, simplify the circuit structure, and reduce the size of circuit layout, so that the circuit layout is simpler, and overall drive timing is more concise, which is applicable to medium-sized and large-sized display panels, and is favorable for narrow frame design of large-sized display panels. Moreover, the gate driving circuit provided by the embodiments of the present disclosure can directly implement change of display resolution by changing clock timing, so that the screen display resolution is programmable, and partition display can be implemented without changing the circuit structure.

At least one embodiment of the present disclosure further provides a display panel. The display panel includes the gate driving circuit provided by any one embodiment of the present disclosure. The display panel can reduce the amount of transistors, simplify the circuit structure, and reduce the size of circuit layout, so that the circuit layout is simpler, and overall drive timing is more concise, which is applicable to medium-sized and large-sized display panels, is favorable for narrow frame design of large-sized display panels, and can directly implement change of display resolution by changing clock timing, so as to implement partition display.

FIG. 17 is a schematic block diagram of a display panel provided by some embodiments of the present disclosure. As illustrated in FIG. 17, the display panel 20 includes a gate driving circuit 21; the gate driving circuit 21 is the gate driving circuit provided by any one embodiment of the present disclosure. For example, the display panel 20 may be a liquid crystal display panel, an OLED display panel, a quantum dot light-emitting diode (QLED) display panel, a micro light-emitting diode (Micro LED) display panel, or other applicable display panels. Correspondingly, structures of light-emitting elements adopted by the pixels in the display panel 20 include various types, for example, an OLED, a QLED, a Micro LED, or other applicable devices, which may be selected according to actual needs, and will not be limited in the embodiments of the present disclosure.

For example, the display panel 20 may be a rectangular panel, a circular panel, an elliptical panel, or a polygonal panel, etc. In addition, the display panel 20 may not only be a plane panel, or may also be a curved panel, or even be a spherical panel, etc. For example, the display panel 20 may also have a touch function, that is, the display panel 20 may be a touch display panel. For example, the display panel 20 may be applied to a mobile phone, a tablet personal computer, a television, a monitor, a laptop, a digital photo frame, a navigator, and any other product or component having a display function. For example, the display panel 20 may be a flexible display panel, and thus may meet various actual application requirements, and for example, the display panel 20 may be applied to curved screens, etc.

For clarity and conciseness, the embodiments of the present disclosure do not provide all constituent units of the display panel 20. In order to implement basic functions of the display panel 20, those skilled in the art may provide and arrange other structures not illustrated according to specific needs, which will not be limited in the embodiments of the present disclosure.

Description of the technical effects of the gate driving circuit 10 according to the embodiments of the present disclosure may be referred to for technical effects of the display panel 20 provided by the above-described embodiments, and no details will be repeated here.

At least one embodiment of the present disclosure further provides a display device. The display device includes the display panel provided by any one embodiment of the present disclosure. The display device may reduce the amount of transistors, simplify the circuit structure, and reduce the size of circuit layout, so that the circuit layout is simpler, and overall drive timing is more concise, which is applicable to medium-sized and large-sized display panels, is favorable for narrow frame design of large-sized display panels, and may directly implement change of display resolution by changing clock timing, so as to implement partition display.

Figure 18:
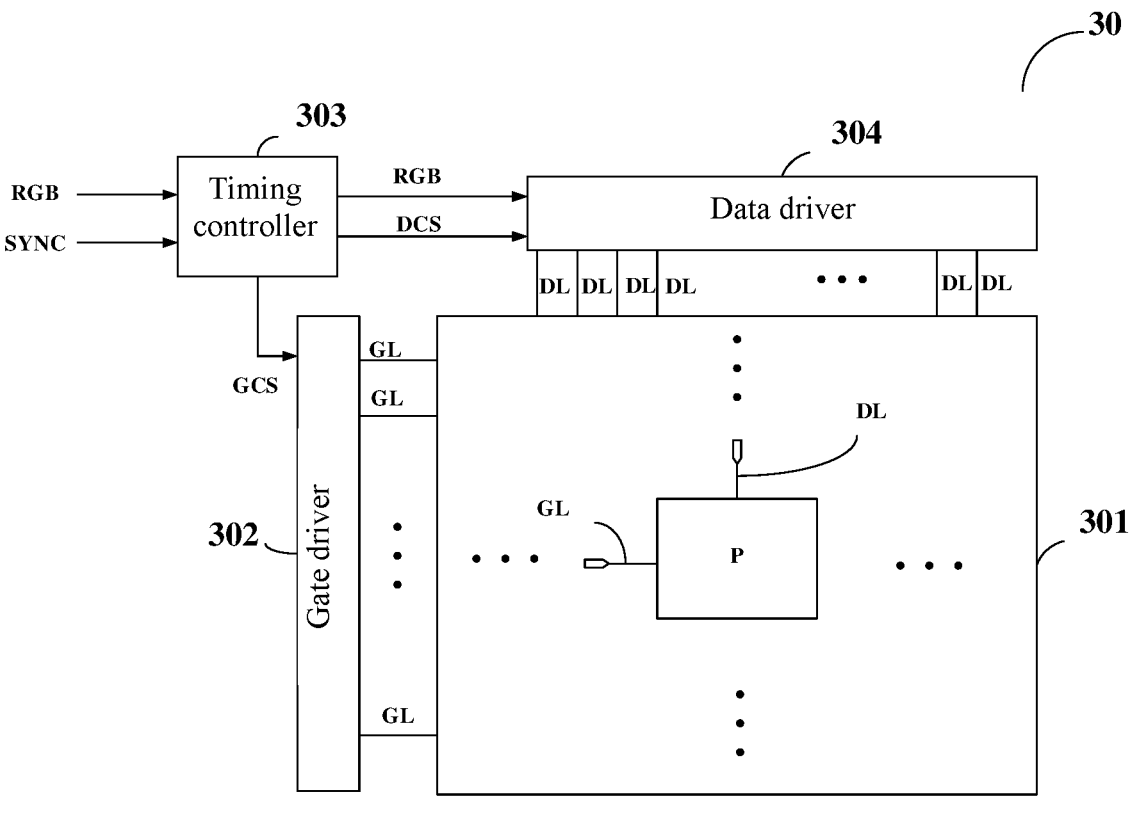
FIG. 18 is a schematic block diagram of a display device provided by some embodiments of the present disclosure.

FIG. 18 is a schematic block diagram of a display device provided by some embodiments of the present disclosure. As illustrated in FIG. 18, the display device 30 includes a display panel 301, a gate driver 302, a timing controller 303, and a data driver 304. The display panel 301 includes a plurality of pixel units P defined by a plurality of gate lines GL and a plurality of data lines DL intersecting with each other. The display panel 301 is, for example, the display panel provided by any one embodiment of the present disclosure, for example, the display panel 20 described above. The plurality of gate lines GL receive the first scanning signal and the second scanning signal as described above. The plurality of data lines DL include data lines Vdata. The gate driver 302 is used for driving the plurality of gate lines GL; the data driver 304 is used for driving the plurality of data lines DL; the timing controller 303 is used for processing image data RGB input from outside the display device 30, supplying processed image data RGB to the data driver 304, and outputting gate control signals GCS and data control signals DCS to the gate driver 302 and the data driver 304, respectively, so as to control the gate driver 302 and the data driver 304.

For example, the gate driver 302 may be implemented as a semiconductor chip, or may also be integrated into the display panel 301 to form a GOA circuit. The gate driver 302, for example, is the gate driving circuit provided by any one embodiment of the present disclosure.

For example, the data driver 304 converts the digital image data RGB input from the timing controller 303 into data signals by using a reference gamma voltage according to a plurality of data control signals DCS originated from the timing controller 303. The data driver 304 supplies converted data signals to the plurality of data lines DL. For example, the data driver 304 may be implemented as a semiconductor chip.

For example, the timing controller 303 processes the externally input image data RGB to match the size and resolution of the display panel 301, and then supplies the processed image data to the data driver 304. The timing controller 303 generates a plurality of gate control signals GCS and a plurality of data control signals DCS by using synchronization signals (e.g., a dot clock signal DCLK, a data enabling signal DE, a horizontal synchronization signal Hsync, and a vertical synchronization signal Vsync) input from outside the display device 30. The timing controller 303 supplies the gate control signals GCS and the data control signals DCS generated to the gate driver 302 and the data driver 304 respectively, for control of the gate driver 302 and the data driver 304.

The display device 30 may further include other components, for example, a signal decoding circuit, a voltage converting circuit, etc.; these components may, for example, be existing conventional components, and no details will be repeated here. The display device 30 may be applied to an e-book, a mobile phone, a tablet personal computer, a television, a monitor, a laptop, a digital photo frame, a navigator, and any other product or component having a display function. Description of the gate driving circuit 10 and the display panel 20 according to the embodiments of the present disclosure may be referred to for detailed description of the display device 30, and no details will be repeated here.

At least one embodiment of the present disclosure further provides a method for driving a gate driving circuit, which may be used for driving the gate driving circuit provided by any one embodiment of the present disclosure. By using the method, the amount of transistors may be reduced, the circuit structure may be simplified, and the size of circuit layout may be reduced, so that the circuit layout is simpler, and overall drive timing is more concise, which is applicable to medium-sized and large-sized display panels, is favorable for narrow frame design of large-sized display panels, and may directly implement change of display resolution by changing clock timing, so as to implement partition display.

For example, in some examples, the method includes operations below: allowing a same group of shift register units to operate under control of a same second node, so as to output N signals which are sequentially shifted, thereby outputting M*N signals which are sequentially shifted by adopting the gate driving circuit.

It should be noted that the corresponding description of the gate driving circuit 10 according to the embodiments of the present disclosure may be referred to for detailed description and technical effects of the driving method, and no details will be repeated here. The driving method may further include more or fewer operations, which will not be limited in the embodiments of the present disclosure.

The following statements should be noted.

(1) The accompanying drawings involve only the structure(s) in connection with the embodiment(s) of the present disclosure, and other structure(s) can be referred to common design(s).

(2) In case of no conflict, features in one embodiment or in different embodiments can be combined to obtain new embodiments.

What have been described above are only specific implementations of the present disclosure, the protection scope of the present disclosure is not limited thereto, and the protection scope of the present disclosure should be based on the protection scope of the claims.

What is claimed is:

1. A gate driving circuit, comprising M groups of shift register units, wherein each group of shift register units comprises N shift register units, the N shift register units output N signals which are sequentially shifted, the M groups of shift register units output M*N signals which are sequentially shifted, and M and N are positive integers;

each group of shift register units comprises one first shift register unit and N−1 second shift register units;

the first shift register unit comprises a first input circuit, a first output circuit, a first control circuit, and a first noise reduction circuit;

the first input circuit is connected to a first input terminal, a first node, and a first source signal terminal, and is configured to write a first source signal of the first source signal terminal into the first node in response to a first input signal of the first input terminal, so as to control a level of the first node;

the first output circuit is connected to the first node, a first clock signal terminal, a first scanning signal output terminal, and a shift signal output terminal, and is configured to receive a first clock signal of the first clock signal terminal, and output a first scanning signal through the first scanning signal output terminal and output a shift signal through the shift signal output terminal under control of the level of the first node;

the first control circuit is connected to the first node, a second clock signal terminal, and a second node, and is configured to control a level of the second node under control of the level of the first node and a second clock signal of the second clock signal terminal;

the first noise reduction circuit is connected to the first node, the second node, the first scanning signal output terminal, and the shift signal output terminal, and is configured to perform noise reduction on the first node, the first scanning signal output terminal, and the shift signal output terminal under control of the level of the second node;

each second shift register unit comprises a second input circuit, a second output circuit, and a second noise reduction circuit;

the second input circuit is connected to a second input terminal, a third node, and a second source signal terminal, and is configured to write a second source signal of the second source signal terminal into the third node in response to a second input signal of the second input terminal, so as to control a level of the third node;

the second output circuit is connected to the third node, a third clock signal terminal, and a second scanning signal output terminal, and is configured to receive a third clock signal of the third clock signal terminal, and output a second scanning signal through the second scanning signal output terminal under control of the level of the third node;

the second noise reduction circuit is connected to the second node, the third node, and the second scanning signal output terminal, and is configured to perform noise reduction on the third node and the second scanning signal output terminal under control of the level of the second node;

in a same group of shift register units, the first shift register unit and the second shift register units share a same second node, and the first input signal received by the first shift register unit and the second input signal received by the second shift register units are a same signal; and a first input signal and a second input signal received by a Kth group of shift register units are a shift signal output by a first shift register unit in a (K−2)th group of shift register units, where 3≤K≤M and K is an integer;

wherein the first shift register unit further comprises a first reset circuit, and the second shift register unit further comprises a second reset circuit;

the first reset circuit is connected to a first reset terminal and the first node, and is configured to reset the first node in response to a first reset signal of the first reset terminal;

the second reset circuit is connected to a second reset terminal and the third node, and is configured to reset the third node in response to a second reset signal of the second reset terminal;

in the same group of shift register units, the first reset signal received by the first shift register unit and the second reset signal received by the second shift register units are a same signal; and a first reset signal and a second reset signal received by a Qth group of shift register units are a shift signal output by a first shift register unit in a (Q+3)th group of shift register units, where 1≤Q≤M−3 and Q is an integer.

2. The gate driving circuit according to claim 1, wherein a 1st group of shift register units receives a first starting signal to serve as a first input signal and a second input signal of the 1st group of shift register units;

a 2nd group of shift register units receives a second starting signal to serve as a first input signal and a second input signal of the 2nd group of shift register units; and the first starting signal is different from the second starting signal.

3. The gate driving circuit according to claim 2, further comprising: a first preposed shift register unit and a second preposed shift register unit, wherein the first preposed shift register unit is configured to receive a trigger signal to output the first starting signal; and the second preposed shift register unit is configured to receive the trigger signal to output the second starting signal.

4. The gate driving circuit according to claim 1, wherein an (M−2)th group of shift register units receives a first initialization signal to serve as a first reset signal and a second reset signal of the (M−2)th group of shift register units;

an (M−1)th group of shift register units receives a second initialization signal to serve as a first reset signal and a second reset signal of the (M−1)th group of shift register units;

an Mth group of shift register units receives a third initialization signal to serve as a first reset signal and a second reset signal of the Mth group of shift register units; and the first initialization signal, the second initialization signal, and the third initialization signal are different from each other.

5. The gate driving circuit according to claim 1, wherein N=4, the gate driving circuit is connected to 16 clock lines, and the 16 clock lines comprise a 1st clock line to a 16th clock line;

each group of shift register units is numbered in an order of the first shift register unit, a first one second shift register unit, a second one second shift register unit, and a third one second shift register unit; the M groups of shift register units are numbered sequentially, so that 4*M shift register units contained in the gate driving circuit are sequentially numbered as a 1st shift register unit to a (4*M)th shift register unit; a (4X+1)th shift register unit is the first shift register unit; a (4X+2)th shift register unit, a (4X+3)th shift register unit, and a (4X+4)th shift register unit are the second shift register units, where X≥20 and X is an integer; and a first clock signal terminal of a (16Y+1)th shift register unit is connected to the 1st clock line; a third clock signal terminal of a (16Y+2)th shift register unit is connected to a 2nd clock line; a third clock signal terminal of a (16Y+3)th shift register unit is connected to a 3rd clock line; a third clock signal terminal of a (16Y+4)th shift register unit is connected to a 4th clock line; a first clock signal terminal of a (16Y+5)th shift register unit is connected to a 5th clock line; a third clock signal terminal of a (16Y+6)th shift register unit is connected to a 6th clock line; a third clock signal terminal of a (16Y+7)th shift register unit is connected to a 7th clock line; a third clock signal terminal of a (16Y+8)th shift register unit is connected to an 8th clock line; a first clock signal terminal of a (16Y+9)th shift register unit is connected to a 9th clock line; a third clock signal terminal of a (16Y+10)th shift register unit is connected to a 10th clock line; a third clock signal terminal of a (16Y+11)th shift register unit is connected to a 11th clock line; a third clock signal terminal of a (16Y+12)th shift register unit is connected to a 12th clock line; a first clock signal terminal of a (16Y+13)th shift register unit is connected to a 13th clock line; a third clock signal terminal of a (16Y+14)th shift register unit is connected to a 14th clock line; a third clock signal terminal of a (16Y+15)th shift register unit is connected to a 15th clock line; and a third clock signal terminal of a (16Y+16)th shift register unit is connected to the 16th clock line, where Y≥0 and Y is an integer.

6. The gate driving circuit according to claim 5, wherein a second clock signal terminal of the (16Y+1)th shift register unit is connected to the 9th clock line; a second clock signal terminal of the (16Y+5)th shift register unit is connected to the 13th clock line; a second clock signal terminal of the (16Y+9)th shift register unit is connected to the 1st clock line; and a second clock signal terminal of the (16Y+13)th shift register unit is connected to the 5th clock line.

7. The gate driving circuit according to claim 1, wherein N=4, the gate driving circuit is connected to 16 clock lines, and the 16 clock lines comprise a 1st clock line to a 16th clock line;

each group of shift register units is numbered in an order of a first one second shift register unit, the first shift register unit, a second one second shift register unit, and a third one second shift register unit; the M groups of shift register units are numbered sequentially, so that 4*M shift register units contained in the gate driving circuit are sequentially numbered as a 1st shift register unit to a (4*M)th shift register unit; a (4D+2)th shift register unit is the first shift register unit; a (4D+1)th shift register unit, a (4D+3)th shift register unit, and a (4D+4)th shift register unit are the second shift register units, where D≥0 and D is an integer; and a third clock signal terminal of a (16J+1)th shift register unit is connected to the 1st clock line; a first clock signal terminal of a (16J+2)th shift register unit is connected to a 2nd clock line; a third clock signal terminal of a (16J+3)th shift register unit is connected to a 3rd clock line; a third clock signal terminal of a (16J+4)th shift register unit is connected to a 4th clock line; a third clock signal terminal of a (16J+5)th shift register unit is connected to a 5th clock line; a first clock signal terminal of a (16J+6)th shift register unit is connected to a 6th clock line; a third clock signal terminal of a (16J+7)th shift register unit is connected to a 7th clock line; a third clock signal terminal of a (16J+8)th shift register unit is connected to an 8th clock line; a third clock signal terminal of a (16J+9)th shift register unit is connected to a 9th clock line; a first clock signal terminal of a (16J+10)th shift register unit is connected to a 10th clock line; a third clock signal terminal of a (16J+11)th shift register unit is connected to a 11th clock line; a third clock signal terminal of a (16J+12)th shift register unit is connected to a 12th clock line; a third clock signal terminal of a (16J+13)th shift register unit is connected to a 13th clock line; a first clock signal terminal of a (16J+14)th shift register unit is connected to a 14th clock line; a third clock signal terminal of a (16J+15)th shift register unit is connected to a 15th clock line; and a third clock signal terminal of a (16J+16)th shift register unit is connected to the 16th clock line, where J≥0 and J is an integer.

8. The gate driving circuit according to claim 7, wherein a second clock signal terminal of the (16J+2)th shift register unit is connected to the 10th clock line; a second clock signal terminal of the (16J+6)th shift register unit is connected to the 14th clock line; a second clock signal terminal of the (16J+10)th shift register unit is connected to the 2nd clock line; and a second clock signal terminal of the (16J+14)th shift register unit is connected to the 6th clock line.

9. The gate driving circuit according to claim 5,
wherein the 1st clock line to the 16th clock line output 16 different clock signals, and the 16 different clock signals are sequentially shifted in terms of timing; or
among the 16 clock lines, clock signals output from a (4L+1)th clock line to a (4L+4)th clock line are identical, where L≥0 and L is an integer, the 1st clock line to the 16th clock line output 4 different clock signals, and the 4 different clock signals are sequentially shifted in terms of timing; or
among the 16 clock lines, clock signals output from a (2H+1)th clock line to a (2H+2)th clock line are identical, where H≥0 and H is an integer, the 1st clock line to the 16th clock line output 8 different clock signals, and the 8 different clock signals are sequentially shifted in terms of timing.

10. The gate driving circuit according to claim 1, wherein N=2, the gate driving circuit is connected to 8 clock lines, and the 8 clock lines comprise a 1st clock line to an 8th clock line;

each group of shift register units is numbered in an order of the first shift register unit and the second shift register unit; the M groups of shift register units are numbered sequentially, so that 2*M shift register units contained in the gate driving circuit are sequentially numbered as a 1st shift register unit to a (2*M)th shift register unit; a (2G+1)th shift register unit is the first shift register unit, and a (2G+2)th shift register unit is the second shift register units, where G≥0 and G is an integer; and a first clock signal terminal of a (8Z+1)th shift register unit is connected to the 1st clock line; a third clock signal terminal of a (8Z+2)th shift register unit is connected to a 2nd clock line; a first clock signal terminal of a (8Z+3)th shift register unit is connected to a 3rd clock line; a third clock signal terminal of a (8Z+4)th shift register unit is connected to a 4th clock line; a first clock signal terminal of a (8Z+5)th shift register unit is connected to a 5th clock line; a third clock signal terminal of a (8Z+6)th shift register unit is connected to a 6th clock line; a first clock signal terminal of a (8Z+7)th shift register unit is connected to a 7th clock line; and a third clock signal terminal of a (8Z+8)th shift register unit is connected to the 8th clock line, where Z≥0 and Z is an integer.

11. The gate driving circuit according to claim 10, wherein a second clock signal terminal of the (8Z+1)th shift register unit is connected to the 5th clock line; a second clock signal terminal of the (8Z+3)th shift register unit is connected to the 7th clock line; a second clock signal terminal of the (8Z+5)th shift register unit is connected to the 1st clock line; and a second clock signal terminal of the (8Z+7)th shift register unit is connected to the 3rd clock line.

12. The gate driving circuit according to claim 10,
wherein the 1st clock line to the 8th clock line output 8 different clock signals, and the 8 different clock signals are sequentially shifted in terms of timing; or
among the 8 clock lines, clock signals output from a (2R+1)th clock line to a (2R+2)th clock line are identical, where R≥0 and R is an integer, the 1st clock line to the 8th clock line output 4 different clock signals, and the 4 different clock signals are sequentially shifted in terms of timing.

13. The gate driving circuit according to claim 1, wherein the first shift register unit further comprises a first initial reset circuit;
the first initial reset circuit is connected to a first initial reset terminal and the first node, and is configured to reset the first node in response to a first initial reset signal of the first initial reset terminal;
the second shift register unit further comprises a second initial reset circuit; and
the second initial reset circuit is connected to a second initial reset terminal and the third node, and is configured to reset the third node in response to a second initial reset signal of the second initial reset terminal.

14. The gate driving circuit according to claim 13, wherein the first shift register unit further comprises a third noise reduction circuit; and
the third noise reduction circuit is connected to the second node and the shift signal output terminal, and is configured to perform noise reduction on the second node under control of the shift signal.

15. The gate driving circuit according to claim 14, wherein the first input circuit comprises a first transistor, a gate electrode of the first transistor is connected to the first input terminal, a first electrode of the first transistor is connected to the first source signal terminal, and a second electrode of the first transistor is connected to the first node;
the first reset circuit comprises a second transistor, a gate electrode of the second transistor is connected to the first reset terminal, a first electrode of the second transistor is connected to the first node, and a second electrode of the second transistor is connected to a first voltage terminal;
the first initial reset circuit comprises a third transistor, a gate electrode of the third transistor is connected to the first initial reset terminal, a first electrode of the third transistor is connected to the first node, and a second electrode of the third transistor is connected to a second voltage terminal;
the first control circuit comprises a fourth transistor and a fifth transistor, a gate electrode and a first electrode of the fourth transistor are connected to the second clock signal terminal, a second electrode of the fourth transistor is connected to the second node, a gate electrode of the fifth transistor is connected to the first node, a first electrode of the fifth transistor is connected to the second node, and a second electrode of the fifth transistor is connected to the second voltage terminal;
the first output circuit comprises a sixth transistor, a seventh transistor, and a first capacitor, a gate electrode of the sixth transistor is connected to the first node, a first electrode of the sixth transistor is connected to the first clock signal terminal, a second electrode of the sixth transistor is connected to the shift signal output terminal, a gate electrode of the seventh transistor is connected to the first node, a first electrode of the seventh transistor is connected to the first clock signal terminal, a second electrode of the seventh transistor is connected to the first scanning signal output terminal, a first electrode of the first capacitor is connected to the first node, and a second electrode of the first capacitor is connected to the first scanning signal output terminal;
the first noise reduction circuit comprises an eighth transistor, a ninth transistor, and a tenth transistor, a gate electrode of the eighth transistor is connected to the second node, a first electrode of the eighth transistor is connected to the first node, a second electrode of the eighth transistor is connected to the second voltage terminal, a gate electrode of the ninth transistor is connected to the second node, a first electrode of the ninth transistor is connected to the shift signal output terminal, a second electrode of the ninth transistor is connected to the second voltage terminal, a gate electrode of the tenth transistor is connected to the second node, a first electrode of the tenth transistor is connected to the first scanning signal output terminal, and a second electrode of the tenth transistor is connected to the second voltage terminal; and
the third noise reduction circuit comprises an eleventh transistor, a gate electrode of the eleventh transistor is connected to the shift signal output terminal, a first electrode of the eleventh transistor is connected to the second node, and a second electrode of the eleventh transistor is connected to the second voltage terminal.

16. The gate driving circuit according to claim 14, wherein the second input circuit comprises a twelfth transistor, a gate electrode of the twelfth transistor is connected to the second input terminal, a first electrode of the twelfth transistor is connected to the second source signal terminal, and a second electrode of the twelfth transistor is connected to the third node;
the second reset circuit comprises a thirteenth transistor, a gate electrode of the thirteenth transistor is connected to the second reset terminal, a first electrode of the thirteenth transistor is connected to the third node, and a second electrode of the thirteenth transistor is connected to a third voltage terminal;
the second initial reset circuit comprises a fourteenth transistor, a gate electrode of the fourteenth transistor is connected to the second initial reset terminal, a first electrode of the fourteenth transistor is connected to the third node, and a second electrode of the fourteenth transistor is connected to a fourth voltage terminal;
the second output circuit comprises a fifteenth transistor and a second capacitor, a gate electrode of the fifteenth transistor is connected to the third node, a first electrode of the fifteenth transistor is connected to the third clock signal terminal, a second electrode of the fifteenth transistor is connected to the second scanning signal output terminal, a first electrode of the second capacitor is connected to the third node, and a second electrode of the second capacitor is connected to the second scanning signal output terminal; and
the second noise reduction circuit comprises a sixteenth transistor and a seventeenth transistor, a gate electrode of the sixteenth transistor is connected to the second node, a first electrode of the sixteenth transistor is connected to the third node, a second electrode of the sixteenth transistor is connected to a fourth voltage terminal, a gate electrode of the seventeenth transistor is connected to the second node, a first electrode of the seventeenth transistor is connected to the second scanning signal output terminal, and a second electrode of the seventeenth transistor is connected to the fourth voltage terminal.

17. A display panel, comprising the gate driving circuit according to claim 1.

18. A display device, comprising the display panel according to claim 17.

19. A method for driving the gate driving circuit according to claim 1, comprising:

enabling a same group of shift register units to operate under control of a same second node, so as to output N signals which are sequentially shifted, thereby outputting M*N signals which are sequentially shifted by adopting the gate driving circuit.

* * * * *